(12) United States Patent
Nagai et al.

(10) Patent No.: US 11,291,125 B2
(45) Date of Patent: Mar. 29, 2022

(54) MULTILAYER SUBSTRATE, ELECTRONIC DEVICE, AND METHOD OF MANUFACTURING MULTILAYER SUBSTRATE

(71) Applicant: Murata Manufacturing Co., Ltd., Nagaokakyo (JP)

(72) Inventors: Tomohiro Nagai, Nagaokakyo (JP); Shigeru Tago, Nagaokakyo (JP); Kazuhiro Yamaji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/098,681

(22) Filed: Nov. 16, 2020

(65) Prior Publication Data

US 2021/0068268 A1    Mar. 4, 2021

Related U.S. Application Data

(63) Continuation of application No. PCT/JP2019/022482, filed on Jun. 6, 2019.

(30) Foreign Application Priority Data

Jun. 7, 2018    (JP) .............................. JP2018-109747

(51) Int. Cl.
*H05K 1/02*    (2006.01)
*H05K 3/28*    (2006.01)
(Continued)

(52) U.S. Cl.
CPC ......... *H05K 3/4644* (2013.01); *H05K 1/0215* (2013.01); *H05K 1/0225* (2013.01);
(Continued)

(58) Field of Classification Search
CPC ........ H05K 1/02; H05K 1/024; H05K 1/0215; H05K 1/0219; H05K 1/0224;
(Continued)

(56) References Cited

U.S. PATENT DOCUMENTS 2,812,501 A    11/1957  Sommers
2012/0326812 A1    12/2012  Ohhira
(Continued)

FOREIGN PATENT DOCUMENTS

JP    4823979 U    3/1979
JP    2016-092561 A    5/2016
(Continued)

OTHER PUBLICATIONS

Official Communication issued in International Patent Application No. PCT/JP2019/022482, dated Jul. 30, 2019.

*Primary Examiner* — Xiaoliang Chen
(74) *Attorney, Agent, or Firm* — Keating & Bennett, LLP

(57) ABSTRACT

A multilayer substrate includes a laminate, first and second signal lines, first and second ground conductors, and interlayer connection conductors. The first and second signal lines extend along a transmission direction and include parallel extending portions that extend in parallel or substantially in parallel with each other. The first and second ground conductors sandwich the first and second signal lines in a laminating direction. The first and second ground conductors respectively include a first opening and a third opening between the signal lines when viewed from the laminating direction, and respectively include second openings and fourth openings disposed outside in a width direction orthogonal or substantially orthogonal to the transmission direction in the parallel extending portions when viewed from the laminating direction. The interlayer con-
(Continued)

nection conductors are disposed in the transmission direction and at least between the signal lines.

20 Claims, 12 Drawing Sheets

(51) Int. Cl.
    *H01P 3/08*     (2006.01)
    *H01L 23/48*     (2006.01)
    *H01L 23/66*     (2006.01)
    *H05K 3/46*     (2006.01)

(52) U.S. Cl.
    CPC ... *H05K 1/0239* (2013.01); *H05K 2201/0129* (2013.01); *H05K 2203/06* (2013.01)

(58) Field of Classification Search
    CPC ...... H05K 1/0253; H05K 1/0393; H05K 3/28; H05K 2201/0183; H05K 2201/0191; H05K 2201/0715; H05K 2201/0969; H05K 2201/09036; H05K 2201/09263; H05K 2201/09309; H05K 2201/09681; H05K 2201/09727; H01P 3/003; H01P 3/08; H01P 3/081; H01P 3/085; H01P 3/088; H01L 23/48; H01L 23/66; H01L 23/49838

USPC ............ 174/255, 261; 333/4, 161, 238, 246; 361/760, 777, 778

See application file for complete search history.

(56) References Cited

U.S. PATENT DOCUMENTS

| | | |
|---|---|---|
| 2015/0318595 A1 | 11/2015 | Yosui et al. |
| 2017/0033426 A1 | 2/2017 | Baba et al. |

FOREIGN PATENT DOCUMENTS

| | | |
|---|---|---|
| WO | 2011/108725 A1 | 9/2011 |
| WO | 2014/115607 A1 | 7/2014 |
| WO | 2016/088592 A1 | 6/2016 |

MULTILAYER SUBSTRATE, ELECTRONIC DEVICE, AND METHOD OF MANUFACTURING MULTILAYER SUBSTRATE

CROSS REFERENCE TO RELATED APPLICATIONS

This application claims the benefit of priority to Japanese Patent Application No. 2018-109747 filed on Jun. 7, 2018 and is a Continuation Application of PCT Application No. PCT/JP2019/022482 filed on Jun. 6, 2019. The entire contents of each application are hereby incorporated herein by reference.

BACKGROUND OF THE INVENTION

1. Field of the Invention

The present invention relates to a multilayer substrate in which a plurality of transmission lines are provided in a laminate including a plurality of base material layers that are laminated, an electronic device provided with the multilayer substrate, and a method of manufacturing the multilayer substrate.

2. Description of the Related Art

Conventionally, there is known a multilayer substrate in which a plurality of transmission lines are provided in a laminate formed by laminating a plurality of base material layers.

For example, International Publication No. WO 2014/115607 shows a multilayer substrate including a laminate and a conductor pattern (a first reference ground conductor, a second reference ground conductor, a first signal line, a second signal line, a first auxiliary ground conductor, and a second auxiliary ground conductor) formed in the laminate. The multilayer substrate is configured with a first transmission line including the first signal line, and the first reference ground conductor and the first auxiliary ground conductor sandwiching the first signal line in a laminating direction, and a second transmission line including the second signal line, and the second reference ground conductor and the second auxiliary ground conductor sandwiching the second signal line in the laminating direction.

In the multilayer substrate, independent ground conductors are provided for each of the transmission lines, and the ground conductors of the adjacent transmission lines are separated from each other. With this configuration, the isolation between the transmission lines is ensured, and the crosstalk between the plurality of signal lines is reduced or prevented. Further, in the multilayer substrate, in order to adjust the impedance of the transmission line, an opening is formed in a portion of the auxiliary ground conductor that overlaps with the signal line in plan view.

However, when the signal line overlaps with the opening of the auxiliary ground conductor in plan view, the impedance of the transmission line may fluctuate greatly when a position of the opening is displaced due to misalignment or the like during laminating the base material layers.

SUMMARY OF THE INVENTION

Preferred embodiments of the present invention provide multilayer substrates in each of which, in a configuration including a ground conductor provided with an opening, the crosstalk between the signal lines is reduced or prevented, and fluctuations in impedance of the transmission line caused by, for example, lamination misalignment are reduced or prevented, and provide electronic devices each including a multilayer substrate according to a preferred embodiment of the present invention.

A multilayer substrate according to a preferred embodiment of the present invention includes a laminate including a plurality of base material layers that are laminated; a first signal line and a second signal line provided in the laminate, extending along a transmission direction, and including parallel extending portions extending in parallel or substantially in parallel with each other; a first ground conductor and a second ground conductor provided in the laminate and sandwiching the first signal line and the second signal line in a laminating direction of the plurality of base material layers; and a plurality of interlayer connection conductors provided in the laminate and connecting the first ground conductor to the second ground conductor.

The plurality of interlayer connection conductors are arrayed in the transmission direction and are disposed at least between the first signal line and the second signal line in the parallel extending portions, the first ground conductor includes a first opening and a second opening, and the second ground conductor includes a third opening and a fourth opening.

The first opening and the third opening extend continuously along the parallel extending portions, and are disposed between the first signal line and the second signal line in the parallel extending portions when viewed from the laminating direction, and the second opening and the fourth opening are disposed further outside in a width direction orthogonal or substantially orthogonal to the transmission direction than the parallel extending portions.

According to this configuration, because the openings of the ground conductors are provided at positions that do not overlap with the signal lines when viewed from the laminating direction, even if the lamination misalignment or the like of the plurality of base material layers occurs when the laminate is formed, large fluctuations of capacitance generated between the signal line and the ground conductor are reduced or prevented. Therefore, the fluctuations of the characteristic impedance of the transmission line are effectively reduced or prevented (the continuity of the characteristic impedance is maintained).

Further, according to this configuration, because electromagnetic waves generated from one of the signal lines are radiated to the outside from the first opening and the third opening, the coupling between the adjacent signal lines via the ground conductor is reduced or prevented. That is, with this configuration, the isolation between the transmission lines (between the first transmission line including the first signal line, the first ground conductor, and the second ground conductor, and the second transmission line including the second signal line, the first ground conductor, and the second ground conductor) increases, and the crosstalk between the signal lines is reduced or prevented.

A method of manufacturing a multilayer substrate according to a preferred embodiment of the present invention includes a conductor forming step of forming a first signal line and a second signal line extending along a transmission direction and including parallel extending portions extending in parallel or substantially in parallel with each other, a first ground conductor, and a second ground conductor on any of a plurality of base material layers; an opening forming step of forming a first opening and a second opening extending in the transmission direction in the first ground conductor, and forming a third opening and a fourth opening extending in the transmission direction in the second ground conductor; a laminate forming step of forming, after the conductor forming step and the opening forming step, a laminate by laminating the plurality of base material layers such that the first ground conductor and the second ground conductor sandwich the first signal line and the second signal line, and heat pressing the plurality of base material layers that are laminated; and an interlayer conductor forming step of connecting the first ground conductor to the second ground conductor and forming the plurality of interlayer connection conductors arrayed in the transmission direction in any of the plurality of base material layers.

In the method, the first opening and the third opening are disposed between the first signal line and the second signal line in the parallel extending portions when viewed from the laminating direction, the second opening and the fourth opening are disposed further outside in a width direction orthogonal or substantially orthogonal to the transmission direction than the parallel extending portions, and the plurality of interlayer connection conductors is at least partially disposed between the first signal line and the second signal line in the parallel extending portions.

According to this manufacturing method, it is possible to easily manufacture a multilayer substrate in which the crosstalk between the signal lines is reduced or prevented and the fluctuations in impedance of the transmission lines due to the lamination misalignment or the like are reduced or prevented.

According to preferred embodiments of the present invention, it is possible to provide multilayer substrates in each of which, in a configuration including a ground conductor that includes an opening, the crosstalk between the signal lines is reduced or prevented, and fluctuations in the impedance of the transmission line caused by such as lamination misalignment are reduced or prevented, and to provide electronic devices each including a multilayer substrate according to a preferred embodiment of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
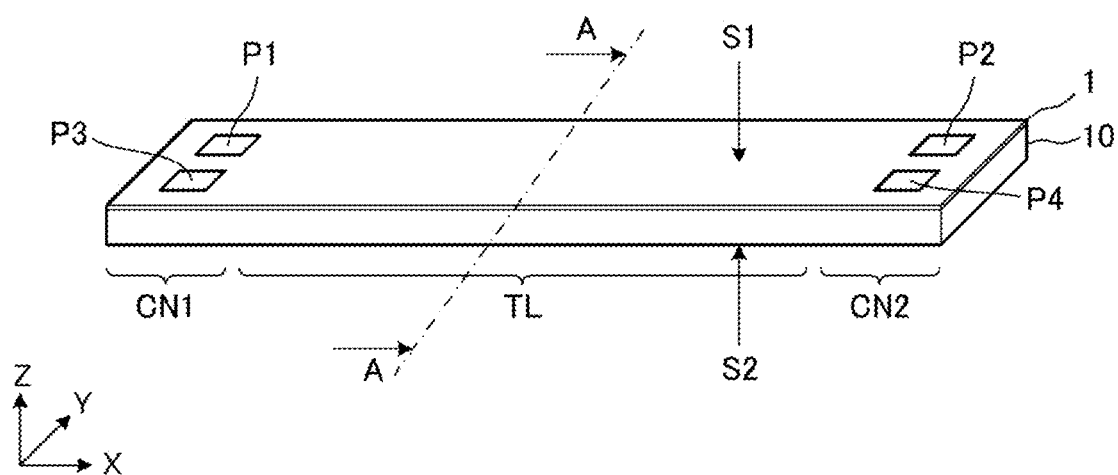
FIG. 1 is an external perspective view of a multilayer substrate 101 according to a first preferred embodiment of the present invention.

Hereinafter, preferred embodiments of the present invention will be described with reference to specific examples and the drawings. In each figure, the same or corresponding elements and portions are designated by the same reference numerals. Although preferred embodiments are shown separately for convenience in consideration of the explanation of main points or the ease of understanding, partial replacement or combination of the configurations shown in different preferred embodiments is possible. In the second and subsequent preferred embodiments, the description of matters common to the first preferred embodiment is omitted, and only different points are described. In particular, the same advantageous actions and effects of the same configuration are not successively described for each preferred embodiment.

First Preferred Embodiment

Figure 2:
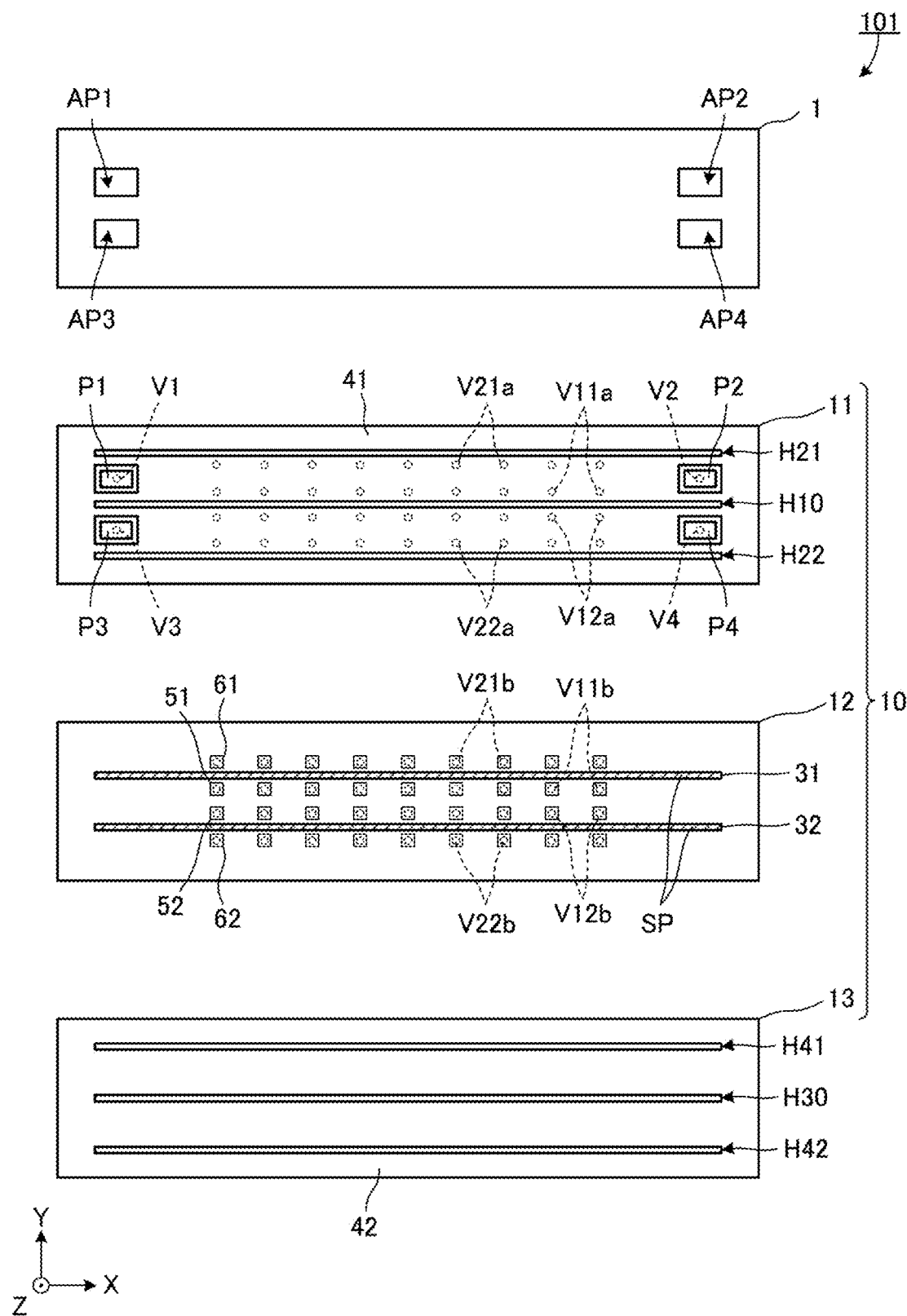
FIG. 2 is an exploded plan view of the multilayer substrate 101.
Figure 3:
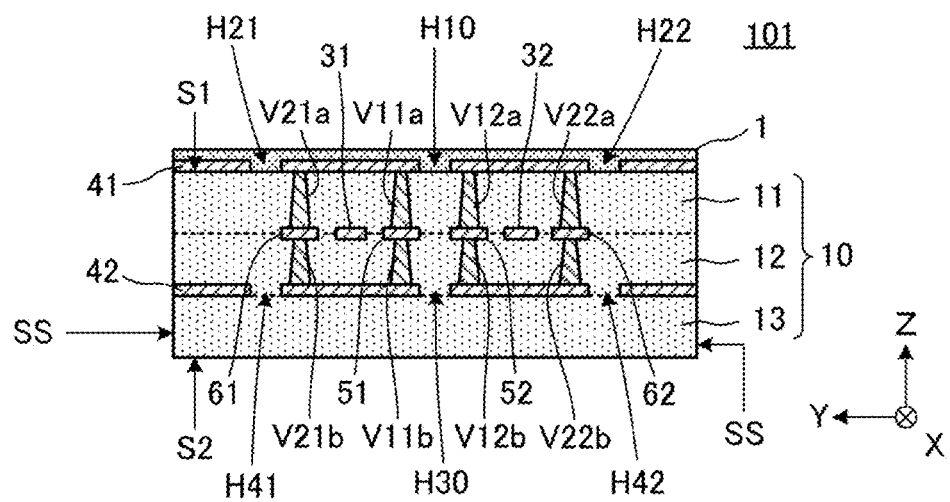
FIG. 3 is a sectional view taken along a line A-A in FIG. 1.
Figure 4:
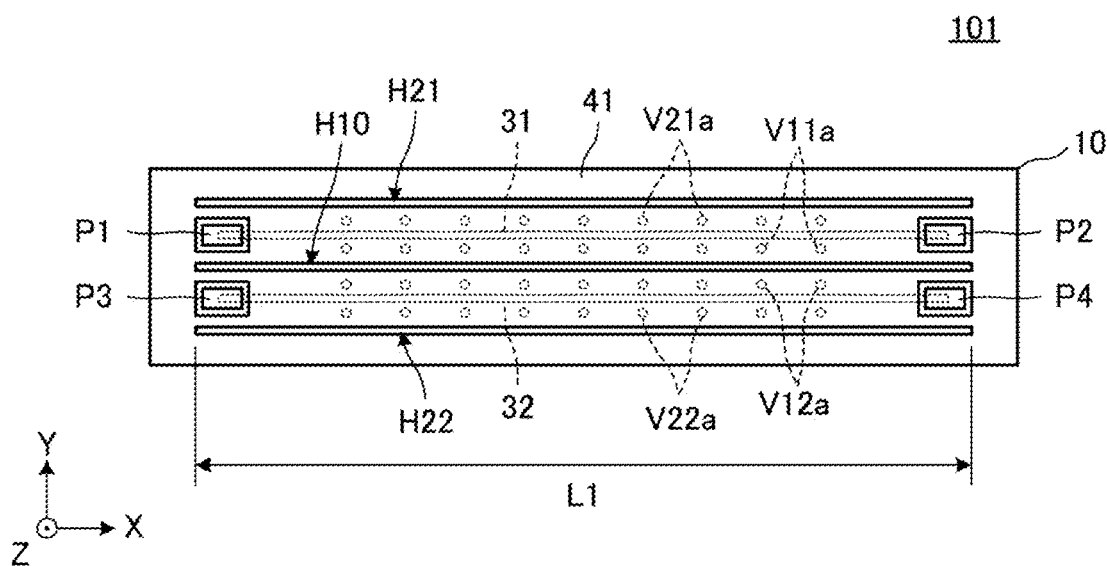
FIG. 4 is a plan view of the multilayer substrate 101.
Figure 5A:
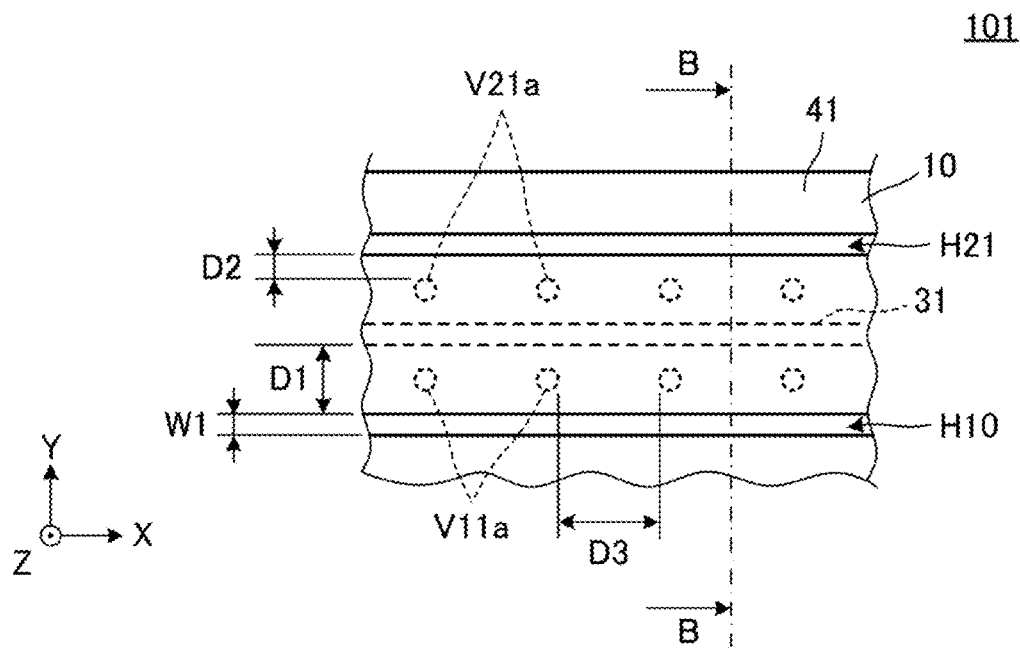
FIG. 5A is an enlarged plan view of a line portion TL of the multilayer substrate 101.
Figure 5B:
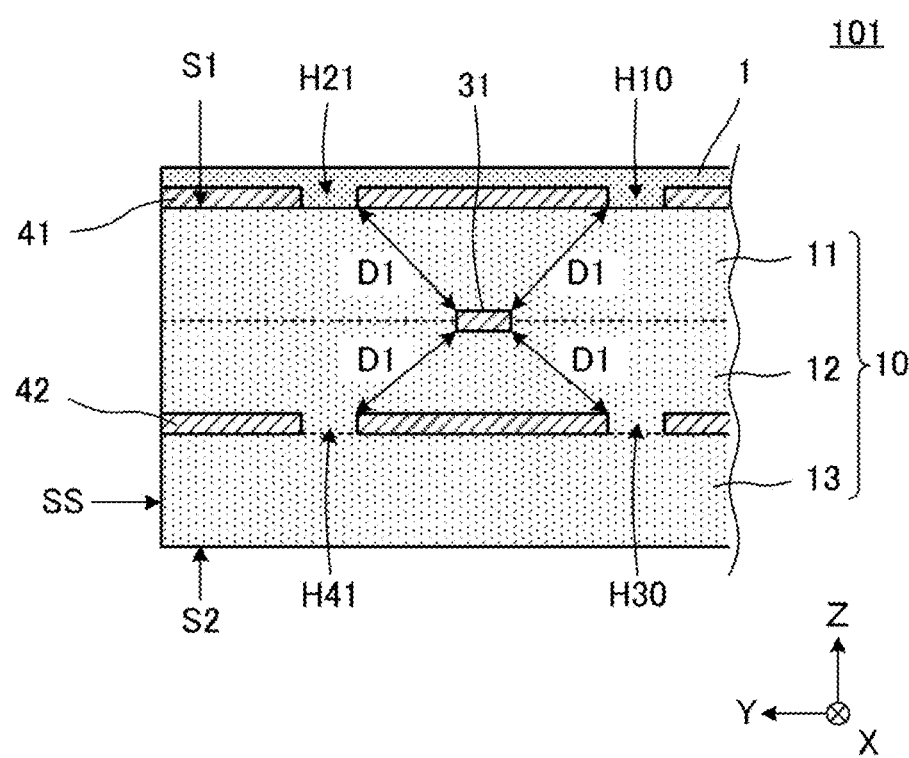
FIG. 5B is a sectional view taken along a line B-B in FIG. 5A.

FIG. 1 is an external perspective view of a multilayer substrate 101 according to a first preferred embodiment of the present invention. FIG. 2 is an exploded plan view of the multilayer substrate 101. FIG. 3 is a sectional view taken along a line A-A in FIG. 1. FIG. 4 is a plan view of the multilayer substrate 101. FIG. 5A is an enlarged plan view of a line portion TL of the multilayer substrate 101, and FIG. 5B is a sectional view taken along a line B-B in FIG. 5A. In FIG. 2, in order to make a structure easy to understand, parallel extending portions SP of a first signal line 31 and a second signal line 32 are shown by hatching. Further, in FIGS. 4 and 5A, a protective layer 1 is not shown.

As will be described in detail below, the multilayer substrate 101 according to the present preferred embodiment is an electronic component that is, for example, surface-mounted on a circuit board and is used in a frequency band of the super high frequency (SHF) band or the extra high frequency (EHF) band. The multilayer substrate 101 includes a first connecting portion CN1, a second connecting portion CN2, and a line portion TL. In the first connecting portion CN1, external electrodes P1 and P3 are exposed on an upper surface shown in FIG. 1, and in the second connecting portion CN2, external electrodes P2 and P4 are exposed on the upper surface shown in FIG. 1. As will be described in detail later, the line portion TL includes stripline transmission lines (a first transmission line and a second transmission line) connecting between the first connecting portion CN1 and the second connecting portion CN2.

The multilayer substrate 101 includes a laminate 10, the first signal line 31, the second signal line 32, a first ground conductor 41, a second ground conductor 42, a plurality of auxiliary ground conductors 51, 52, 61, and 62, the external electrodes P1, P2, P3, and P4, a plurality of interlayer connection conductors V1, V2, V3, V4, V11a, V11b, V12a, V12b, V21a, V21b, V22a, and V22b, the protective layer 1, and other elements. The external electrodes P1 and P2 correspond to the "first external electrode", and the external electrodes P3 and P4 correspond to the "second external electrode". Further, the interlayer connection conductors V1 to V4 are examples of the "signal interlayer connection conductor".

The laminate 10 is a rectangular or substantially rectangular flat plate whose longitudinal direction coincides with the X-axis direction, and includes a first main surface S1 and a second main surface S2 facing each other. The first signal line 31, the second signal line 32, the second ground conductor 42, the auxiliary ground conductors 51, 52, 61, and 62, and the plurality of interlayer connection conductors V11a, V11b, V12a, V12b, V21a, V21b, V22a, and V22b are provided inside the laminate 10, and the first ground conductor 41 and the external electrodes P1, P2, P3, and P4 are provided on the first main surface S1 of the laminate 10. Further, the protective layer 1 is provided on the first main surface S1 of the laminate 10.

The laminate 10 includes a plurality of base material layers 13, 12, and 11 mainly made of thermoplastic resin, for example, that are laminated in this order. The plurality of base material layers 11, 12, and 13 are rectangular or substantially rectangular flat plates that are flexible and whose longitudinal directions coincide with the X-axis direction. The plurality of base material layers 11, 12, and 13 are preferably, for example, sheets whose main material is, for example, liquid crystal polymer (LCP) or polyetheretherketone (PEEK).

The first ground conductor 41 and the external electrodes P1, P2, P3, and P4 are provided on the surface of the base material layer 11. The first ground conductor 41 is a conductor pattern provided on the entire or substantially the entire surface of the base material layer 11. The external electrodes P1 and P3 are rectangular or substantially rectangular conductor patterns provided near a first end of the base material layer 11 (the left end of the base material layer 11 in FIG. 2). The external electrodes P2 and P4 are rectangular or substantially rectangular conductor patterns provided near a second end of the base material layer 11 (the right end of the base material layer 11 in FIG. 2). The first ground conductor 41 and the external electrodes P1, P2, P3, and P4 are conductor patterns preferably made of, for example, a copper (Cu) foil.

Further, the first ground conductor 41 includes a first opening H10 and second openings H21 and H22. The first opening H10 and the second openings H21 and H22 are through holes (conductor non-formed portions) extending along the transmission direction (X-axis direction). The second opening H22, the first opening H10, and the second opening H21 are arranged in this order in the width direction (+Y direction).

Further, the plurality of interlayer connection conductors V1, V2, V3, V4, V11a, V12a, V21a, and V22a are provided in the base material layer 11. The interlayer connection conductors V11a, V12a, V21a, and V22a are arrayed in the transmission direction (X-axis direction), respectively. The interlayer connection conductors V1, V2, V3, V4, V11a, V12a, V21a, and V22a are, for example, via conductors provided by arranging, in through holes provided in the base material layer, conductive paste including powder of, for example, one or more metal among Cu and tin (Sn) or alloy thereof and a resin component, and thereafter, solidifying the paste by heat pressing in a lamination process.

The first signal line 31, the second signal line 32, and the plurality of auxiliary ground conductors 51, 52, 61, and 62 are provided on the surface of the base material layer 12. The first signal line 31 and the second signal line 32 are linear conductor patterns extending in the transmission direction (X-axis direction), and include the parallel extending portions SP extending in parallel or substantially in parallel with each other. In the present preferred embodiment, as shown in FIG. 2, the first signal line 31 and the second signal line 32 correspond in their entirety to the parallel extending portions SP. The auxiliary ground conductors 51, 52, 61, and 62 are rectangular or substantially rectangular conductor patterns arrayed in the transmission direction, respectively. The first signal line 31, the second signal line 32, and the plurality of auxiliary ground conductors 51, 52, 61, and 62 are conductor patterns made of, for example, a Cu foil.

Further, the plurality of interlayer connection conductors V11b, V12b, V21b, and V22b are provided in the base material layer 12. The interlayer connection conductors V11b, V12b, V21b, and V22b are arrayed in the transmission direction (X-axis direction), respectively. The interlayer connection conductors V11b, V12b, V21b, and V22b are, for example, via conductors provided by arranging, in through holes provided in the base material layer, conductive paste including powder of one or more metal among Cu and Sn or alloy thereof and a resin component, and thereafter, solidifying the paste by heat pressing in a lamination process.

The second ground conductor 42 is provided on the surface of the base material layer 13. The second ground conductor is a conductor pattern provided on the entire or substantially the entire surface of the base material layer 13. The second ground conductor 42 includes a third opening H30 and fourth openings H41 and H42. The third opening H30 and the fourth openings H41 and H42 are through holes (conductor non-formed portions) extending along the transmission direction (X-axis direction). The fourth opening H42, the third opening H30, and the fourth opening H41 are arranged in this order in the width direction (+Y direction). The second ground conductor 42 is a conductor pattern made of, for example, Cu foil.

The protective layer 1 has the same or substantially the same planar shape as the base material layer 11, and is a protective film laminated on the surface of the base material layer 11. The protective layer 1 includes openings AP1, AP2, AP3, and AP4 at positions corresponding to the positions of the external electrodes P1, P2, P3, and P4, respectively. Therefore, the external electrodes P1, P2, P3, and P4 are exposed to the outside by providing the protective layer 1 on the surface of the base material layer 11 (the first main surface S1 of the laminate 10). The protective layer 1 is preferably, for example, a coverlay film, a solder resist film, or an epoxy resin film.

The external electrode P1 overlaps with the first end of the first signal line 31 when viewed from the laminating direction (Z-axis direction), and is connected to the first end of the first signal line 31 via the interlayer connection conductor V1. The external electrode P2 overlaps with the second end of the first signal line 31 when viewed from the laminating direction, and is connected to the second end of the first signal line 31 via the interlayer connection conductor V2. The external electrode P3 overlaps with the first end of the second signal line 32 when viewed from the laminating direction, and is connected to the first end of the second signal line 32 via the interlayer connection conductor V3. The external electrode P4 overlaps with the second end of the second signal line 32 when viewed from the laminating direction, and is connected to the second end of the second signal line 32 via the interlayer connection conductor V4.

As shown in FIG. 3 and other figures, the first ground conductor 41 and the second ground conductor 42 sandwich the first signal line 31 and the second signal line 32 in the laminating direction (Z-axis direction) of the plurality of base material layers 11, 12, and 13. In the present preferred embodiment, a first transmission line defined by a stripline includes the first signal line 31, the first ground conductor 41, the second ground conductor 42, the base material layer 11 sandwiched between the first signal line 31 and the first ground conductor 41, and the second base material layer 12 sandwiched between the first signal line 31 and the second ground conductor 42. Further, in the present preferred embodiment, a second transmission line defined by a stripline includes the second signal line 32, the first ground conductor 41, the second ground conductor 42, the base material layer 11 sandwiched between the second signal line 32 and the first ground conductor 41, and the second base material layer 12 sandwiched between the second signal line 32 and the second ground conductor 42.

The plurality of interlayer connection conductors V11a, V11b, V12a, V12b, V21a, V21b, V22a, and V22b connect the first ground conductor 41 to the second ground conductor 42. Specifically, the first ground conductor 41 is connected to the second ground conductor 42 via the auxiliary ground conductor 51 and the interlayer connection conductors V11a and V11b. The first ground conductor 41 is connected to the second ground conductor 42 via the auxiliary ground conductor 52 and the interlayer connection conductors V12a and V12b. The first ground conductor 41 is connected to the second ground conductor 42 via the auxiliary ground conductor 61 and the interlayer connection conductors V21a and V21b. Further, the first ground conductor 41 is connected to the second ground conductor 42 via the auxiliary ground conductor 62 and the interlayer connection conductors V22a and V22b.

The diameters of the interlayer connection conductors V11a, V11b, V12a, V12b, V21a, V21b, V22a, and V22b are preferably, for example, about 100 μm to about 150 μm.

As shown in FIGS. 3, 4, and other figures, the plurality of interlayer connection conductors V11a, V11b, V12a, and V12b, and the plurality of auxiliary ground conductors 51 and 52 are disposed between the first signal line 31 and the second signal line 32 in the parallel extending portions. Further, the interlayer connection conductors V11a, V11b, V21a, and V21b, and the auxiliary ground conductors 51 and 61 sandwich the first signal line 31 in the width direction (Y-axis direction), and the interlayer connection conductors V12a, V12b, V22a, and V22b, and the auxiliary ground conductors 52 and 62 sandwich the second signal line 32 in the width direction.

The first opening H10 and the third opening H30 extend along the parallel extending portions (the first signal line 31 and the second signal line 32), and are disposed between the first signal line 31 and the second signal line 32 in the parallel extending portions when viewed from the laminating direction (Z-axis direction). Further, the second openings H21 and H22 and the fourth openings H41 and H42 are disposed outside the parallel extending portions in the width direction (Y-axis direction).

Further, the opening of the ground conductor (the first opening H10, the second opening H21 or H22, the third opening H30, or the fourth opening H41 or H42) is disposed at a position that does not overlap with the signal lines (the first signal line 31 and the second signal line 32) when viewed from the laminating direction (Z-axis direction).

In the present preferred embodiment, a length L1 of any of the first opening H10, the second openings H21 and H22, the third opening H30, and the fourth openings H41 and H42 in the transmission direction (X-axis direction) is equal to or more than a wavelength $\lambda$ of the frequency band used (L1≥$\lambda$). Further, in the present preferred embodiment, a width W1 of the first opening H10, the second opening H21 or H22, the third opening H30, or the fourth opening H41 or H42 is preferably equal to or less than about a tenth of the wavelength $\lambda$ of the frequency band used (W1≤$\lambda$/10), for example.

Further, a distance D3 between the plurality of interlayer connection conductors (the interlayer connection conductors V11a, V11b, V12a, V12b, V21a, V21b, V22a, and V22b) arrayed in the transmission direction (X-axis direction) is preferably equal to or less than about a tenth of the wavelength $\lambda$ of the frequency band used (D3≤$\lambda$/10), for example.

Further, in the present preferred embodiment, a distance D1 between the opening of the ground conductor (either the first opening H10, the second opening H21 or H22, the third opening H30, or the fourth opening H41 or H42) and the signal line (the first signal line 31 or the second signal line 32) is preferably equal to or less than about a tenth of the wavelength $\lambda$ of the frequency band used (D1≤$\lambda$/10), for example. Further, a distance D2 between the opening of the ground conductor (either the first opening H10, the second opening H21 or H22, the third opening H30, and the fourth opening H41 or H42) and the plurality of interlayer connection conductors (either V11a, V11b, V12a, V12b, V21a, V21b, V22a, or V22b) is preferably equal to or less than about a tenth of the wavelength $\lambda$ of the frequency band used (D2≤$\lambda$/10), for example.

Figure 6:
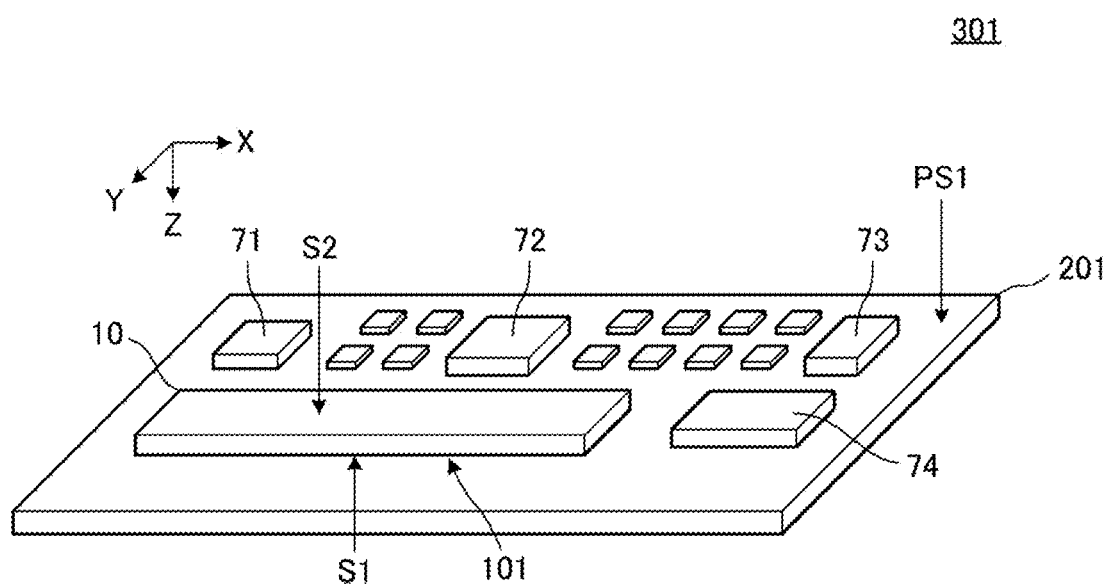
FIG. 6 is a perspective view showing a main portion of an electronic device 301 according to the first preferred embodiment of the present invention.

The multilayer substrate 101 is used, for example, as follows. FIG. 6 is a perspective view showing a main portion of an electronic device 301 according to the first preferred embodiment.

The electronic device 301 includes a multilayer substrate 101, a circuit board 201, components 71, 72, 73, and 74, and others. The circuit board 201 is preferably, for example, a glass/epoxy substrate. The components 71, 72, 73, and 74 are preferably, for example, chip components such as chip inductors and chip capacitors, radio-frequency integrated circuit (RFIC) elements, impedance matching circuits, and others.

The multilayer substrate 101 and components 71, 72, 73, and 74 are surface-mounted on an upper surface PS1 of the circuit board 201. The external electrodes (not shown) of the multilayer substrate 101 are directly soldered to lands (not shown) provided on the upper surface PS1 of the circuit board 201. Further, the components 71, 72, 73, and 74 are directly soldered to the lands (not shown) provided on the upper surface PS1 of the circuit board 201, respectively. Although the electronic device 301 includes a configuration other than the above, the drawing thereof is not shown in FIG. 6.

According to the multilayer substrate 101 according to the present preferred embodiment, the following advantageous effects are obtained.

In the present preferred embodiment, the opening of the ground conductor (the first opening H10, the second opening H21 or H22, the third opening H30, or the fourth opening H41 or H42) does not overlap with the signal line (the first signal line 31 or the second signal line 32) when viewed from the laminating direction (Z-axis direction). Therefore, even if the lamination misalignment or the like occurs in the plurality of base material layers 11, 12, and 13 when the laminate 10 is formed, large fluctuations in capacitance between the signal line and the ground conductor are reduced or prevented, and fluctuations in characteristic impedance of the transmission line are effectively reduced or prevented (the continuity of the characteristic impedance is maintained).

Further, in the present preferred embodiment, the first opening H10 and the third opening H30 extending along the parallel extending portions (the first signal line 31 and the second signal line 32) are disposed between the first signal line 31 and the second signal line 32 when viewed from the laminating direction (Z-axis direction). According to this configuration, the electromagnetic waves generated from one of the signal lines are radiated to the outside from the first opening H10 and the third opening H30, and therefore, the coupling between the adjacent signal lines via the ground conductor is reduced or prevented. As shown in FIG. 3, the first opening H10 and the third opening H30 provided in the ground conductors 41 and 42, respectively, are preferably disposed between the interlayer connection conductors V11a and V11b and the interlayer connection conductor V12a and V12b which are disposed between the adjacent signal lines (the first signal line 31 and the second signal line 32) in plan view (viewed from the Z-axis direction). As a result, the electromagnetic waves generated from one of the signal lines are radiated to the outside from the first opening H10 or the third opening H30, and accordingly, the coupling between the adjacent signal lines via the interlayer connection conductors V11a, V11b, V12a, and V12b connected to the ground conductors 41 and 42, and via the ground conductors 41 and 42 is reduced or prevented. That is, with this configuration, the isolation between the transmission lines (between the first transmission line and the second transmission line) increases, and the crosstalk between the signal lines is reduced or prevented. In particular, because the electromagnetic waves in the EHF band (millimeter waves) are easily radiated evenly from a narrow and small opening, the above configuration improves the isolation between the transmission lines.

Further, as shown in FIG. 4, the first opening H10 and the third opening H30 are preferably disposed at least one of between the external electrodes P1 and P3 or between the external electrodes P2 and P4. According to this configuration, the first opening H10 and the third opening H30 are disposed between the external electrodes P1 and P3 (or between the external electrodes P2 and P4) connected to the signal lines 31 and 32, respectively. That is, the first opening H10 and the third opening H30 are disposed between the interlayer connection conductors connected to the first signal line 31 and the external electrodes, and the interlayer connection conductors connected to the second signal line 32 and the external electrodes. Therefore, the isolation between the transmission lines is further improved.

Further, in the present preferred embodiment, when viewed from the laminating direction (Z-axis direction), the opening (the first opening H10, the second opening H21 or H22, the third opening H30, or the fourth opening H41 or H42) is near the signal lines (the first signal line 31 and the second signal line 32). According to this configuration, the capacitance generated between the signal line and the ground conductor can be reduced. Therefore, the signal line and the ground conductor can be closer to each other, and a multilayer substrate that is thin in the laminating direction can be obtained. Alternatively, even if the capacitance generated between the signal line and the ground conductor is the same or substantially the same, because the line width of the signal line can be widened, a multilayer substrate whose conductor loss of the transmission line is small can be obtained.

In the present preferred embodiment, the ground conductor is provided with the opening, but the ground conductor is not provided independently for each transmission line. Therefore, the area of the ground conductor becomes larger and the ground potential is stabilized as compared with the case in which different ground conductors are provided for each transmission line.

In the present preferred embodiment, the first ground conductor 41 is connected to the second ground conductor 42 via the plurality of auxiliary ground conductors 51, 52, 61, and 62 and the plurality of interlayer connection conductors V11a, V11b, V12a, V12b, V21a, V21b, V22a, and V22b. Therefore, the ground potentials of the first ground conductor 41 and the second ground conductor 42 that sandwich the signal lines in the laminating direction are stabilized, and the electrical characteristics of the transmission line is stabilized.

In the present preferred embodiment, the plurality of interlayer connection conductors V11a, V11b, V12a, and V12b and the plurality of auxiliary ground conductors 51, 52, 61, and 62 arrayed in the transmission direction (X-axis direction) are disposed between the first signal line 31 and the second signal line 32 in the parallel extending portions, and therefore, the isolation between the transmission lines can be improved.

Further, in the present preferred embodiment, the interlayer connection conductors V11a, V11b, V21a, and V21b and the auxiliary ground conductors 51 and 61 sandwich the first signal line 31 in the width direction (Y-axis direction), and the interlayer connection conductors V12a, V12b, V22a, and V22b and the auxiliary ground conductors 52 and 62 sandwich the second signal line 32 in the width direction. With this configuration, the isolation between the transmission lines can be further improved.

In the case of the plurality of base material layers of the multilayer substrate being made of resin material, when the base material layers receive heat above a predetermined temperature, a portion thereof is thermally decomposed to generate gas, such as carbon dioxide ($CO_2$) and water. In addition, oxygen generated by the oxidized conductor pattern being reduced due to heat and carbon in the resin undergo an oxidation reaction to generate $CO_2$. Further, the elements of the laminate absorb moisture during the manufacturing process thereof. When the multilayer substrate is heated while having the above gas and water left in the multilayer substrate, the gas or steam expands and interlayer delamination occurs. Therefore, usually, during the manufacturing of the multilayer substrate, the heat pressing is performed under reduced pressure, and a predetermined preheating step is provided to discharge the gas to the outside of the laminate during the heat pressing.

Note that if the multilayer substrate includes a metal pattern having a large area, the gas cannot pass through the conductor pattern (metal pattern). Therefore, depending on the location where the gas is generated, a gas discharge path to the outside of the multilayer substrate may be longer than that in the case of the conductor pattern not being provided, and the gas may remain in the multilayer substrate. On the other hand, in the present preferred embodiment, because the ground conductor includes the plurality of openings (the first opening H10, the second openings H21 and H22, the third opening H30, and the fourth openings H41 and H42), the gas generated inside when the multilayer substrate is heated is discharged through these openings and short discharge paths. That is, according to this configuration, an amount of gas remaining in the multilayer substrate is reduced, the delamination of the multilayer substrate during heating (during heating in the manufacturing stage and use stage of the multilayer substrate) is reduced, and uniformity of the characteristics impedance of the transmission line is maintained. In addition, the occurrence of irregularities and curvatures on the surface of the multilayer substrate due to the remaining gas is reduced or prevented, and the flatness of the multilayer substrate is improved, and accordingly, the mountability of the multilayer substrate on a circuit board or the like is improved.

In the present preferred embodiment, both of the first opening H10 and the third opening H30 are through holes that continuously extend in the transmission direction (X-axis direction) along the parallel extending portions. With this configuration, the distribution of the first opening H10 and the third opening H30 is less biased, and the degassing effect easily becomes uniform in the plane direction. That is, because the gas is less likely to remain locally, the effect of reducing or preventing delamination is improved.

In the present preferred embodiment, both of the second openings H21 and H22 and the fourth openings H41 and H42 are through holes that continuously extend in the transmission direction (X-axis direction) along the parallel extending portions. In the case of the second opening and the fourth opening being intermittent through holes along the transmission direction, the capacitance generated between the ground conductor and the signal line is easily changed when the lamination misalignment or the like occurs. On the other hand, according to this configuration, it is possible to obtain a multilayer substrate that reduces or prevents large fluctuations in the characteristic impedance of the transmission line due to the lamination misalignment or the like. Further, according to this configuration, the distribution of the second openings H21 and H22 and the fourth openings H41 and H42 is less biased, and the degassing effect becomes uniform more easily in the plane direction. That is, the gas is less likely to remain locally, and the effect of reducing or preventing delamination is further improved. Further, according to this configuration, as compared with the case of the second opening and the fourth opening being the intermittent through holes in the transmission direction, the electromagnetic waves generated from one of the signal lines are easily radiated from the second openings H21 and H22 and the fourth openings H41 and H42. That is, with this configuration, the isolation between the transmission lines is further improved, and the crosstalk between the signal lines is further reduced or prevented.

The number of the second openings and the fourth openings may be plural, and the plurality of second openings and the plurality of fourth openings may be arrayed along the parallel extending portions. However, in terms of the above-described advantageous actions and effects, it is preferable that the second openings and the fourth openings extend in the transmission direction along the parallel extending portions.

In the present preferred embodiment, the laminate 10 is formed by laminating the plurality of base material layers 11, 12, and 13 mainly made of thermoplastic resin, for example. According to this configuration, as will be described in detail below, the laminate 10 can be easily formed by heat pressing (batch pressing) the plurality of laminated base material layers 11, 12, and 13, and therefore, the manufacturing steps of the multilayer substrate 101 can be reduced and the cost can be reduced. Further, with this configuration, the multilayer substrate that can be easily plastically deformed and can maintain (hold) a desired shape can be obtained.

However, when the plurality of base material layers 11, 12, and 13 of the laminate 10 are mainly made of thermoplastic resin, the base material layers tends to flow easily when the plurality of laminated base material layers are heat pressed, and therefore, the conductor pattern provided on the base material layer is easily displaced or deformed. Therefore, the configuration of preferred embodiments of the present invention is particularly effective in reducing or preventing the fluctuations in characteristic impedance of the transmission line.

Further, in the present preferred embodiment, the interlayer connection conductors V11a, V11b, V12a, V12b, V21a, V21b, V22a, and V22b provided in the laminate are via conductors formed by solidifying conductive paste containing resin material. Because these via conductors are formed at the same time by heat pressing the plurality of base material layers 11, 12, and 13 (described in detail later), the via conductors are easy to form. Further, because the conductive paste includes resin material, high bondability between the base material layer mainly made of resin and the interlayer connection conductor can be obtained. The resin material included in the conductive paste is preferably the same type as the resin material of the base material layer.

However, the via conductors including the resin material generate a large amount of gas during heating, and a multilayer substrate provided with the via conductors as such easily cause delamination, surface irregularities, curves, or the like during heating (during heating in the manufacturing stage and use stage). Therefore, in the case of the interlayer connection conductors V11a, V11b, V12a, V12b, V21a, V21b, V22a, and V22b being the via conductors including the resin material, the opening of the ground conductor is preferably provided near the interlayer connection conductors V11a, V11b, V12a, V12b, V21a, V21b, V22a, and V22b. As a result, the gas generated from the via conductor when the multilayer substrate is heated can be efficiently discharged, the delamination of the multilayer substrate can be reduced or prevented, and the flatness of the multilayer substrate can be improved.

In the present preferred embodiment, the length L1 of the first opening H10 and the third opening H30 in the transmission direction (X-axis direction) is preferably equal to or more than the wavelength λ of the frequency band used (L1≥λ).

According to this configuration, the electromagnetic waves generated from one of the signal lines are easily radiated from the first opening H10 or the third opening H30. Therefore, the effect of reducing or preventing the crosstalk can be improved.

Further, in the present preferred embodiment, the length L1 of the second openings H21 and H22 and the fourth openings H41 and H42 in the transmission direction (X-axis direction) is preferably equal to or more than the wavelength λ of the frequency band used (L1≤λ). According to this configuration, the electromagnetic waves generated from one of the signal lines are easily radiated to the outside from the second openings H21 and H22 and the fourth openings H41 and H42, therefore, the effect of reducing or preventing the crosstalk can be improved more effectively.

Further, in the present preferred embodiment, the distance D3 between the plurality of interlayer connection conductors V11a, V11b, V12a, V12b, V21a, V21b, V22a, and V22b arrayed in the transmission direction (X-axis direction) is preferably equal to or less than about a tenth of the frequency band used (D3≤λ/10), for example. By narrowing the distance between the interlayer connection conductors in the transmission direction, the leakage of the electromagnetic waves from the interlayer connection conductors can be effectively reduced or prevented, and therefore, the effect of reducing or preventing the crosstalk can be further improved. In addition, by setting the distance D3 between the plurality of interlayer connection conductors arrayed in the transmission direction to equal to or less than about a tenth of the wavelength λ of the frequency used, the generation and propagation of quarter-wavelength harmonics are reduced or prevented and the influence thereof can be reduced.

In the present preferred embodiment, the distance D1 between the opening of the ground conductor (the first opening H10, the second opening H21 or H22, the third opening H30, or the fourth opening H41 or H42) and the signal line (the first signal line 31 or the second signal line 32) is preferably equal to or less than about a tenth of the wavelength λ of the frequency band used (D1≤λ/10). By arranging the opening of the ground conductor near the signal line, the electromagnetic waves from the signal line are more easily radiated to the outside from the opening. Therefore, the effect of reducing or preventing the crosstalk can be further improved. Further, by setting the distance D1 between the opening of the ground conductor and the signal line to equal to or less than about a tenth of the wavelength λ of the frequency used, the influence of the quarter-wavelength harmonics can be reduced.

Further, in the present preferred embodiment, the distance D2 between the opening of the ground conductor (either the first opening H10, the second opening H21 or H22, the third opening H30, or the fourth opening H41 or H42) and the plurality of interlayer connection conductors (either the interlayer connection conductors V11a, V11b, V12a, V12b, V21a, V21b, V22a, or V22b) is preferably equal to or less than about a tenth of the wavelength λ of the frequency band used (D2≤λ/10), for example. By arranging the opening of the ground conductor near the interlayer connection conductor, the electromagnetic waves generated from the interlayer connection conductor are effectively radiated from the opening, and accordingly, the effect of reducing or preventing the crosstalk is further improved. Further, according to this configuration, when the multilayer substrate is heated, the gas generated from the via conductor containing the resin material can be effectively discharged. Further, by setting the distance D2 between the opening of the ground conductor and the plurality of interlayer connection conductors to equal to or less than about a tenth of the wavelength λ of the frequency used, the influence of the quarter-wavelength harmonics can be reduced.

Further, in the present preferred embodiment, the width W1 of the opening of the ground conductor (the first opening H10, the second opening H21 or H22, the third opening H30, or the fourth opening H41 or H42) is preferably equal to or less than about a tenth of the wavelength λ of the frequency band used (W1≤λ/10), for example.

By reducing the opening area of the ground conductor, the area of the ground conductor becomes relatively large and the ground potential is stabilized. Further, by making the area of the ground conductor relatively large, the ground conductor having a higher Young's modulus than the base material layer including a resin material as a main component, the mechanical strength of the multilayer substrate is increased. Further, by setting the width W1 of the opening of the ground conductor to less than a half of the wavelength λ of the frequency band f used, the influence of unnecessary resonance depending on the size of the opening can be sufficiently reduced. Further, by setting the width W1 of the opening of the ground conductor to equal to or less than a tenth of the wavelength λ of the frequency used, the generation and propagation of the quarter-wavelength harmonics can be reduced or prevented and the influence thereof can be reduced.

In the case of the relative permittivity of the laminate being 3, the frequency band f, the wavelength λ, and the distance D3 between the interlayer connection conductors arrayed in the transmission direction are preferably the following values, for example. In the case of using the frequency band f of about 1 GHz, the wavelength λ is about 173 mm, for example. In the case of using the frequency band f of about 6 GHz, the wavelength λ is about 29 mm, and the distance between the interlayer connection conductors D3 is about 2 mm, for example. In the case of using the frequency band f of about 28 GHz, the wavelength λ is about 6.2 mm, and the distance between the interlayer connection conductors D3 is about 0.5 mm, for example. In the case of using the frequency band f of about 60 GHz, the wavelength λ is about 2.9 mm, and the distance between the interlayer connection conductors D3 is about 0.25 mm, for example.

In the present preferred embodiment, an example in which the plurality of interlayer connection conductors V11a, V11b, V12a, V12b, V21a, V21b, V22a, and V22b are aligned together in the width direction (Y-axis direction) is shown, but the configuration is not limited to this. Array pitches of the interlayer connection conductors V11a, V11b, V12a, V12b, V21a, V21b, V22a, and V22b in the transmission direction (X-axis direction) may be different. That is, the interlayer connection conductors V11a, V11b, V12a, V12b, V21a, V21b, V22a, and V22b do not need to be arrayed in the width direction.

Further, in the present preferred embodiment, an example in which the ground conductors have rectangular or substantially rectangular openings (the first opening H10, the second openings H21 and H22, the third opening H30, and the fourth openings H41 and H42) is shown, but the configuration is not limited to this. In the case of the area and the range of the ground conductor to be provided with the opening being limited, the shape of the opening (conductor non-formed part) is not limited to a rectangular or substantially rectangular shape (straight line), but may be curved or wavy, for example. The phrase the opening "extends continuously along the parallel extending portions" is not limited to the configuration in which the opening extends completely in parallel or substantially in parallel with the parallel extending portion, but may be a configuration that substantially extends along the parallel extending portions. Further, when the outer shape of the ground conductor is curved or wavy, an opening having a shape that follows the outer shape (curved or wavy) may be provided.

Figure 7:
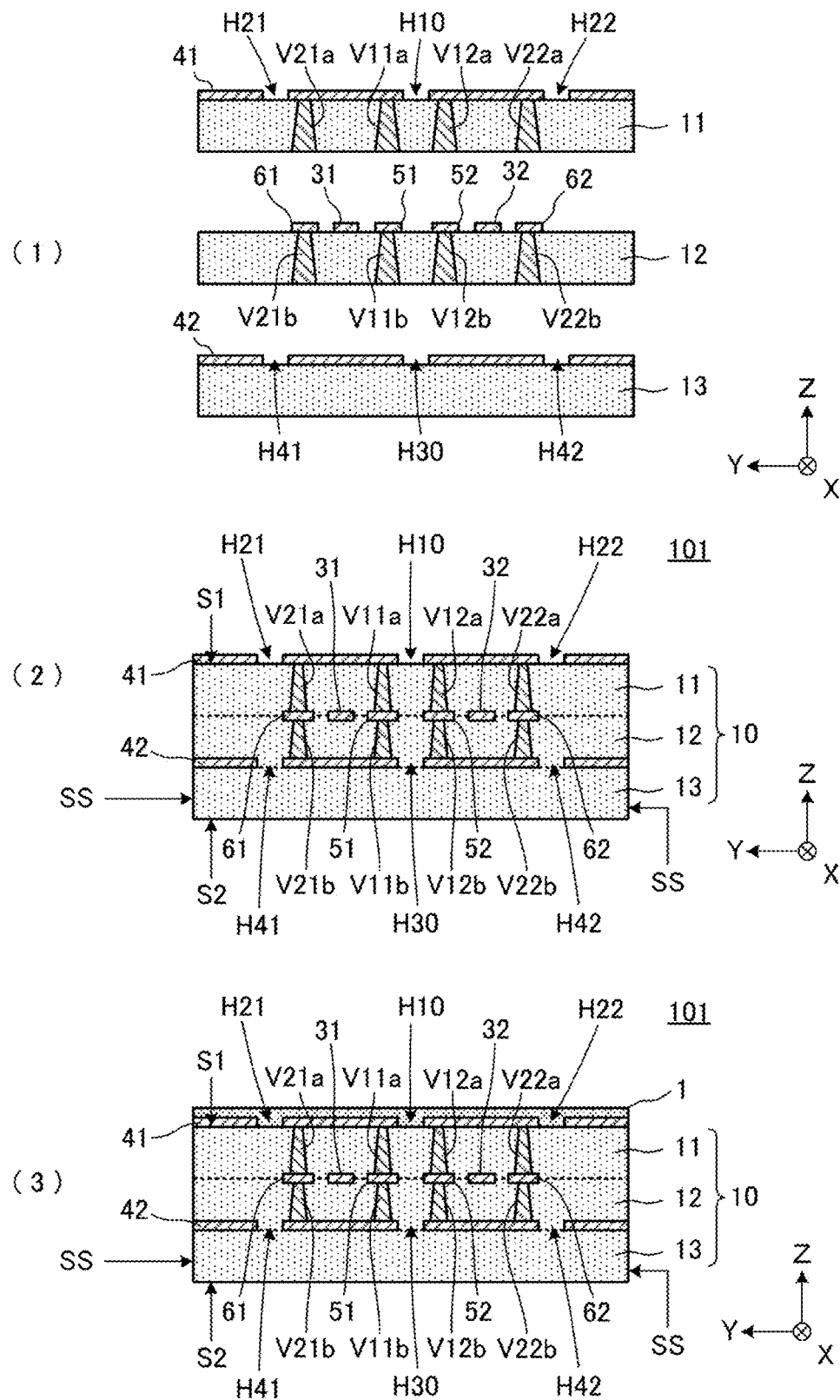
FIG. 7 is a sectional view sequentially showing a manufacturing process of the multilayer substrate 101.

The multilayer substrate 101 according to the present preferred embodiment is manufactured, for example, through the following steps. FIG. 7 is a sectional view sequentially showing a manufacturing process of the multilayer substrate 101. In FIG. 7, for convenience of explanation, the manufacturing process on one chip (individual piece) is described, but the actual manufacturing process of the multilayer substrate is performed in the state of a collective board.

First, as shown in (1) in FIG. 7, the plurality of base material layers 11, 12, and 13 are prepared. The base material layers 11, 12, and 13 are sheets mainly made of thermoplastic resin, such as LCP or PEEK, for example.

Then, on the plurality of base material layers 11, 12, and 13, the first signal line 31, the second signal line 32, the first ground conductor 41, the second ground conductor 42, the plurality of auxiliary ground conductors 51, 52, 61, and 62, and the external electrodes (not shown) are formed. Specifically, metal foils (for example, Cu foil) are laminated on the surfaces of the base material layers 11, 12, and 13, and the metal foils are patterned by photolithography, for example, to form the first ground conductor 41 and the external electrodes (not shown) on the surface of the base material layer 11, the first signal line 31, the second signal line 32, and the plurality of auxiliary ground conductors 51, 52, 61, and 62 on the surface of the base material layer 12, and the second ground conductor 42 on the surface of the base material layer 13.

The first signal line 31 and the second signal line 32 are conductor patterns extending along the transmission direction (X-axis direction) and including the parallel extending portions extending in parallel or substantially parallel with each other. The first ground conductor 41 is formed with the first opening H10 and the second openings H21 and H22. Further, the second ground conductor 42 is formed with the third opening H30 and the fourth openings H41 and H42. The first opening H10, the second openings H21 and H22, the third opening H30, and the fourth openings H41 and H42 are through holes (conductor non-formed parts) extending continuously in the transmission direction. The plurality of auxiliary ground conductors 51, 52, 61, and 62 are conductor patterns arrayed along the transmission direction, respectively.

In this way, this step of forming the first signal line 31, the second signal line 32, the first ground conductor 41, and the second ground conductor 42 on any of the plurality of base material layers 11, 12, and 13 is an example of the "conductor forming step". Further, this step of forming the first opening H10 and the second openings H21 and H22 on the first ground conductor 41, and forming the third opening H30 and the fourth openings H41 and H42 on the second ground conductor 42 is an example of the "opening forming step".

In the present preferred embodiment, an example in which the "conductor forming step" and the "opening forming step" are performed at the same time or substantially at the same time is shown, but the "opening forming step" may be performed after the "conductor forming step".

Further, the plurality of interlayer connection conductors V11a, V12a, V21a, and V22a arrayed in the transmission direction (X-axis direction) and others are formed on the base material layer 11, and the plurality of interlayer connection conductors V11b, V12b, V21b, and V22b arrayed in the transmission direction are formed on the base material layer 12. These interlayer connection conductors are provided by forming a hole (through hole) in at least one of the plurality of base material layers 11 and 12, and then arranging (filling), in through holes, conductive paste including powder of Cu, Sn, or alloy thereof and a resin material, and thereafter, solidifying the conductive paste by heat pressing in the subsequent step. Although not shown, the base material layer 11 is also formed with the interlayer connection conductors (V1 and V2) connecting between the first signal line 31 and the external electrodes (P1 and P2), and the interlayer connection conductors (V3 and V4) connecting between the second signal line 32 and the external electrodes (P3 and P4).

This step of forming the plurality of interlayer connection conductors V11a, V11b, V12a, V21a, V21b, V22a, and V22b arrayed in the transmission direction on any of the plurality of base material layers 11, 12, and 13 is an example of the "interlayer conductor forming step".

Next, as shown in (2) in FIG. 7, the plurality of base material layers 13, 12, and 11 are laminated in this order so as to sandwich the first signal line 31 and the second signal line 32 between the first ground conductor 41 and the second ground conductor 42. At this time, the plurality of base material layers 11, 12, and 13 are laminated such that the external electrodes (P1 and P2) overlap with the first signal line 31 in the parallel extending portion, and the external electrodes (P3 and P4) overlap with the second signal line 32 in the parallel extending portion, when viewed from the laminating direction (not shown). Then, the plurality of laminated base material layers 11, 12, and 13 are heat pressed to form the laminate 10.

This step of laminating the plurality of base material layers 11, 12, and 13 after the "conductor forming step" and the "opening forming step", and heat pressing the plurality of laminated base material layers 11, 12, and 13 to form the laminate 10 is an example of the "laminate forming step".

By this "laminate forming step", the first ground conductor 41 is connected to the second ground conductor 42 via the plurality of auxiliary ground conductors 51, 52, 61, and 62 and the plurality of interlayer connection conductors V11a, V11b, V12a, V12b, V21a, V21b, V22a, and V22b.

Further, by this "laminate forming step", the first opening H10 and the third opening H30 are disposed between the first signal line 31 and the second signal line 32 in the parallel extending portions when viewed from the laminating direction (Z-axis direction). Further, the second openings H21 and H22 and the fourth openings H41 and H42 are disposed outside the parallel extending portions in the width direction (Y-axis direction). At least a portion of the plurality of interlayer connection conductors V11a, V11b, V12a, V12b, V21a, V21b, V22a, and V22b is disposed between the first signal line 31 and the second signal line 32 in the parallel extending portions.

Thereafter, the protective layer 1 is formed on the first main surface S1 of the laminate 10 to obtain the multilayer substrate 101 shown in (3) in FIG. 7.

According to the above-described non-limiting example of a manufacturing method, a multilayer substrate can be easily manufactured in which the crosstalk between the signal lines is reduced or prevented and the fluctuations in impedance of the transmission lines due to the lamination misalignment or the like are reduced or prevented.

Further, according to the above-described non-limiting example of a manufacturing method, because the multilayer substrate 101 can be easily formed by laminating the plurality of base material layers 11, 12, and 13 mainly made of thermoplastic resin and heat pressing (batch pressing) the same, the manufacturing steps can be reduced and the cost can be reduced.

Further, according to the above-described non-limiting example of a manufacturing method, the holes provided in the base material layers are provided with the conductive paste, and the conductive paste can be solidified by heat pressing (batch pressing), therefore, the step of forming the interlayer connection conductors can be reduced.

Figure 8:
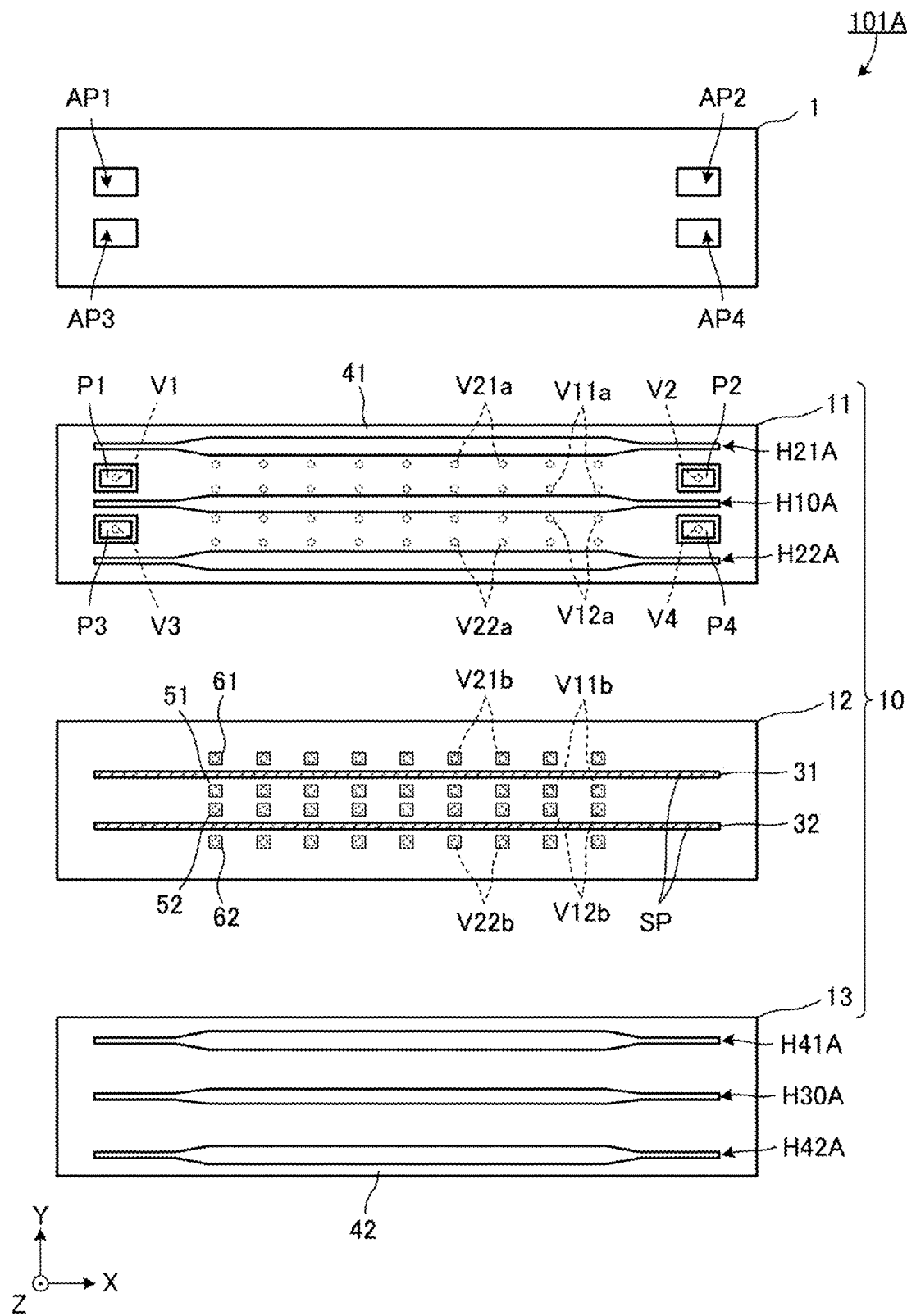
FIG. 8 is an exploded plan view of a multilayer substrate 101A which is a modification of the first preferred embodiment of the present invention.
Figure 9:
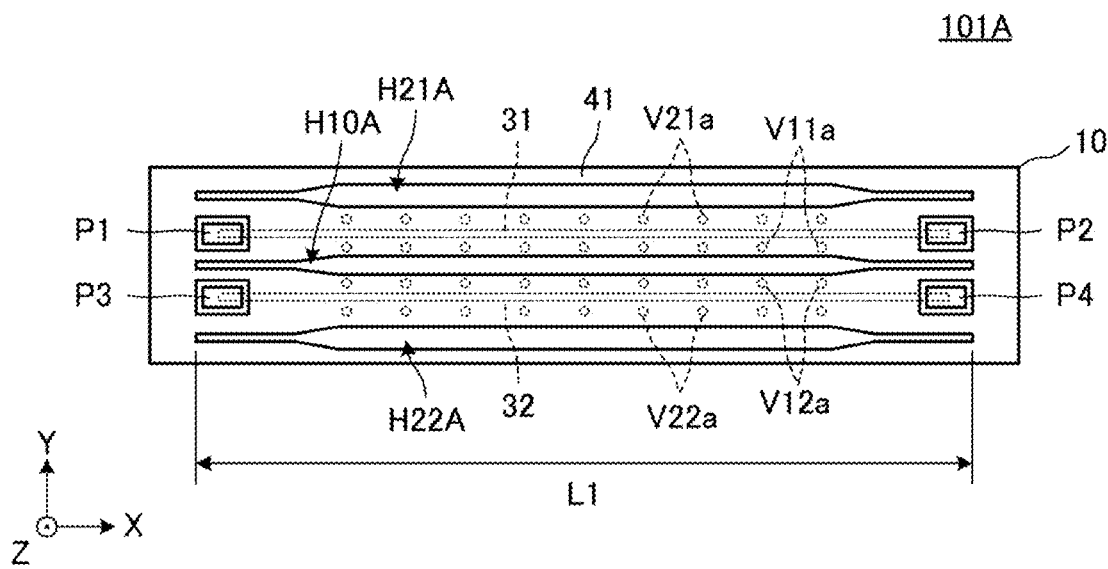
FIG. 9 is a plan view of the multilayer substrate 101A.

Next, a modification of the multilayer substrate 101 is described. FIG. 8 is an exploded plan view of a multilayer substrate 101A which is a modification of the first preferred embodiment. FIG. 9 is a plan view of the multilayer substrate 101A. In FIG. 9, the parallel extending portions SP of the first signal line 31 and the second signal line 32 are shown by hatching, and the protective layer 1 is not shown.

The multilayer substrate 101A is different from the multilayer substrate 101 in that the ground conductor 41 includes a first opening H10A and second openings H21A and H22A, and the ground conductor 42 includes a third opening H30A and fourth openings H41A and H42A. Other configurations of the multilayer substrate 101A are the same or substantially the same as those of the multilayer substrate 101.

The first opening H10A and the second openings H21A and H22A are different in planar shape from the first opening H10 and the second openings H21 and H22 described above. The first opening H10A and the second openings H21A and H22A are through holes extending along the transmission direction (X-axis direction). As shown in FIG. 8, the opening width (width in the Y-axis direction) near the center of each of the first opening H10A and the second openings H21A and H22A in the transmission direction is larger than the opening width at both ends in the transmission direction.

The third opening H30A and the fourth openings H41A and H42A are different from the third opening H30 and the fourth openings H41 and H42 described above. The third opening H30A and the fourth openings H41A and H42A are through holes extending along the transmission direction. As shown in FIG. 8, the opening width near the center of each of the third opening H30A and the fourth openings H41A and H42A in the transmission direction is larger than the opening width at both ends in the transmission direction.

As shown in FIGS. 8 and 9, each of the first opening H10A, the second openings H21A and H22A, the third opening H30A, and the fourth openings H41A and H42A includes the opening width in plan view larger at a portion near the interlayer connection conductors V11a, V11b, V12a, and V12b (near the center in the transmission direction) than other portions. By increasing the opening width of the portion near the interlayer connection conductor in this way, the gas generated during heating can be efficiently discharged to the outside of the laminate. Further, as in the multilayer substrate 101A, by providing the opening width of each of the first opening H10A and the third opening H30A larger at the portion near the interlayer connection conductors V11a, V11b, V12a, and V12b, the effect of reducing or preventing the coupling between the adjacent signal lines can be further improved.

Second Preferred Embodiment

In a second preferred embodiment of the second invention, an example in which the planar shapes of the first opening and the third opening are different from those of the first preferred embodiment is shown.

Figure 10:
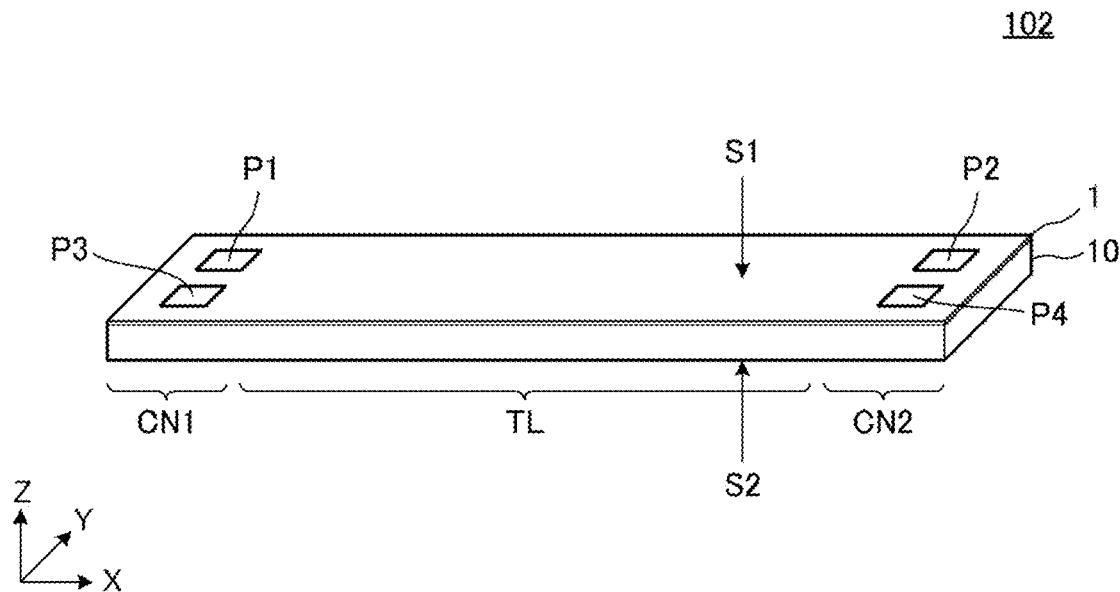
FIG. 10 is an external perspective view of a multilayer substrate 102 according to a second preferred embodiment of the present invention.
Figure 11:
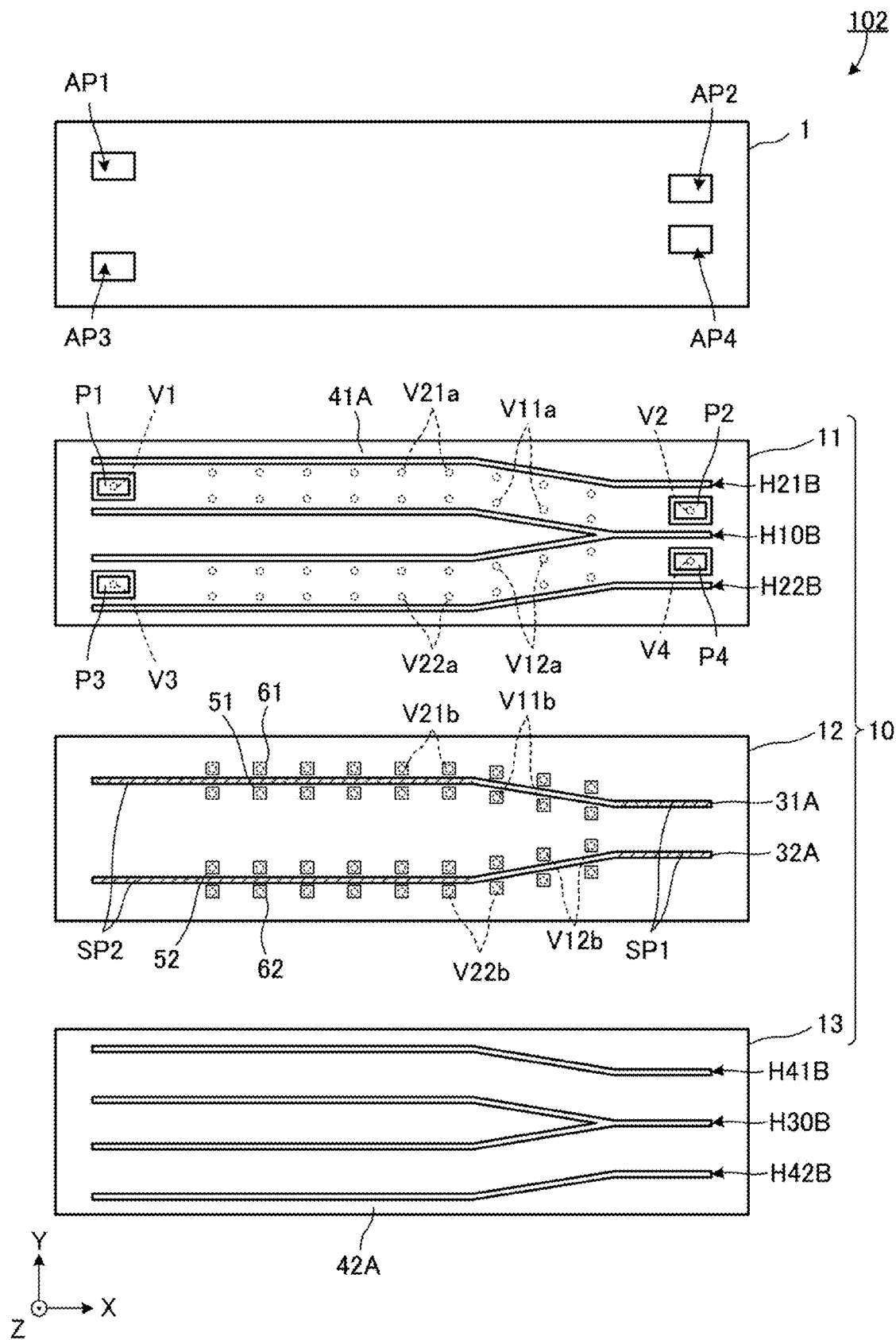
FIG. 11 is an exploded plan view of the multilayer substrate 102.

FIG. 10 is an external perspective view of a multilayer substrate 102 according to the second preferred embodiment. FIG. 11 is an exploded plan view of the multilayer substrate 102. In FIG. 11, parallel extending portions SP of a first signal line 31A and a second signal line 32A are shown by hatching.

The multilayer substrate 102 is different from the multilayer substrate 101 according to the first preferred embodiment in that the multilayer substrate 102 includes the first signal line 31A, the second signal line 32A, and ground conductors 41A and 42A. Other configurations of the multilayer substrate 102 are the same or substantially the same as those of the multilayer substrate 101.

Hereinafter, portions different from the multilayer substrate 101 according to the first preferred embodiment are described.

The first signal line 31A and the second signal line 32A are conductor patterns extending substantially in the X-axis direction, and include parallel extending portions SP1 and SP2. The first signal line 31A includes a portion that extends also in the +Y direction as the signal line extends in the −X direction, in the middle of the longitudinal direction (X-axis direction). The second signal line 32A includes a portion that extends also in the −Y direction as the signal line extends in the −X direction, in the middle of the longitudinal direction (X-axis direction). Therefore, the first signal line 31A and the second signal line 32A include non-parallel extending portions (portions that do not extend in parallel or substantially in parallel with each other) in the middle of the longitudinal direction.

The ground conductor 41A includes a first opening H10B and second openings H21B and H22B. The first opening H10B is a Y-shaped through hole (conductor non-formed portion) extending substantially in the X-axis direction. The first opening H10B includes a bifurcated portion near the center in the longitudinal direction, at which the first opening H10B bifurcates (into a portion that extends in the +Y direction as the opening extends in the −X direction and a portion that extends in the −Y direction as the opening extends in the −X direction). The second openings H21B and H22B are through holes (conductor non-formed portions) extending substantially in the X-axis direction. The second opening H21B includes a portion in the middle of the longitudinal direction that extends also in the +Y direction as the opening extends in the −X direction. The second opening H22B includes a portion in the middle of the longitudinal direction that extends also in the −Y direction as the opening extends in the −X direction.

The ground conductor 42A includes a third opening H30B and fourth openings H41B and H42B. The third opening H30B is a Y-shaped through hole (conductor non-formed portion) extending substantially in the X-axis direction. The third opening H30B includes a bifurcated portion near the center in the longitudinal direction, at which the third opening H30B bifurcates (into a portion that extends in the +Y direction as the opening extends in the −X direction and a portion that extends in the −Y direction as the opening extends in the −X direction). The fourth openings H41B and H42B are through holes (conductor non-formed portions) extending substantially in the X-axis direction. The fourth opening H41B includes a portion in the middle of the longitudinal direction that extends also in the +Y direction as the opening extends in the −X direction. The fourth opening H42B includes a portion in the middle of the longitudinal direction that extends also in the −Y direction as the opening extends in the −X direction.

As shown in the present preferred embodiment, the first signal line and the second signal line do not have to be parallel extending portions in the entire portion thereof, and the non-parallel extending portions may be provided in the middle of the first signal line and the second signal line.

Third Preferred Embodiment

In a third preferred embodiment of the present invention, a multilayer substrate having a different configuration of interlayer connection conductors from the first preferred embodiment is shown.

Figure 12:
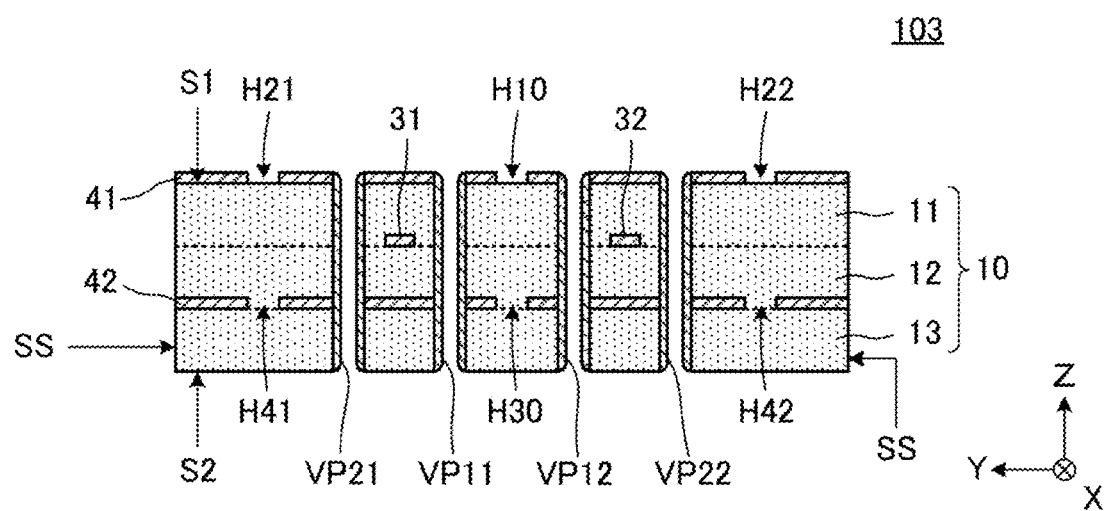
FIG. 12 is a sectional view of a line portion of a multilayer substrate 103 according to a third preferred embodiment of the present invention.

FIG. 12 is a sectional view of a line portion of a multilayer substrate 103 according to the third preferred embodiment.

The multilayer substrate 103 is different from the multilayer substrate 101 according to the first preferred embodiment in that a plurality of auxiliary ground conductors 51, 52, 61, and 62 and a protective layer 1 are not provided. Further, the multilayer substrate 103 is different from the multilayer substrate 101 in that the multilayer substrate 103 includes a plurality of interlayer connection conductors VP11, VP12, VP21, and VP22, instead of a plurality of interlayer connection conductors V11a, V11b, V12a, V12b, V21a, V21b, V22a, and V22b. Other configurations of the multilayer substrate 103 are the same or substantially the same as those of the multilayer substrate 101.

Hereinafter, portions different from the multilayer substrate 101 according to the first preferred embodiment are described.

The plurality of interlayer connection conductors VP11, VP12, VP21, and VP22 are conductor films provided inside through holes extending from a first main surface S1 to a second main surface S2 of a laminate 10. The interlayer connection conductors VP11, VP12, VP21, and VP22 respectively connect the first ground conductor 41 to the second ground conductor 42. The interlayer connection conductors VP11, VP12, VP21, and VP22 are preferably, for example, through hole plating or filled via plating provided in the through holes extending from the first main surface S1 to the second main surface S2 of the laminate 10.

Although not shown, the plurality of interlayer connection conductors VP11, VP12, VP21, and VP22 are arrayed along the transmission direction (X-axis direction). As shown in FIG. 12, the interlayer connection conductors VP11 and VP21 sandwich a first signal line 31 in the width direction (Y-axis direction), and the interlayer connection conductors VP12 and VP22 sandwich a second signal line 32 in the width direction.

According to the present preferred embodiment, because the interlayer connection conductors VP11, VP12, VP21, and VP22 are through hole plating or filled via plating, the amount of gas generated becomes less than that in the case in which the interlayer connection conductor are via conductors including a resin component, and therefore, the delamination of the multilayer substrate during heating is reduced or prevented. However, because the through hole plating and the filled via plating have low gas permeability, it is preferable to provide openings near the interlayer connection conductors VP11, VP12, VP21, and VP22 when viewed from the laminating direction (Z-axis direction), among the ground conductors.

Figure 13:
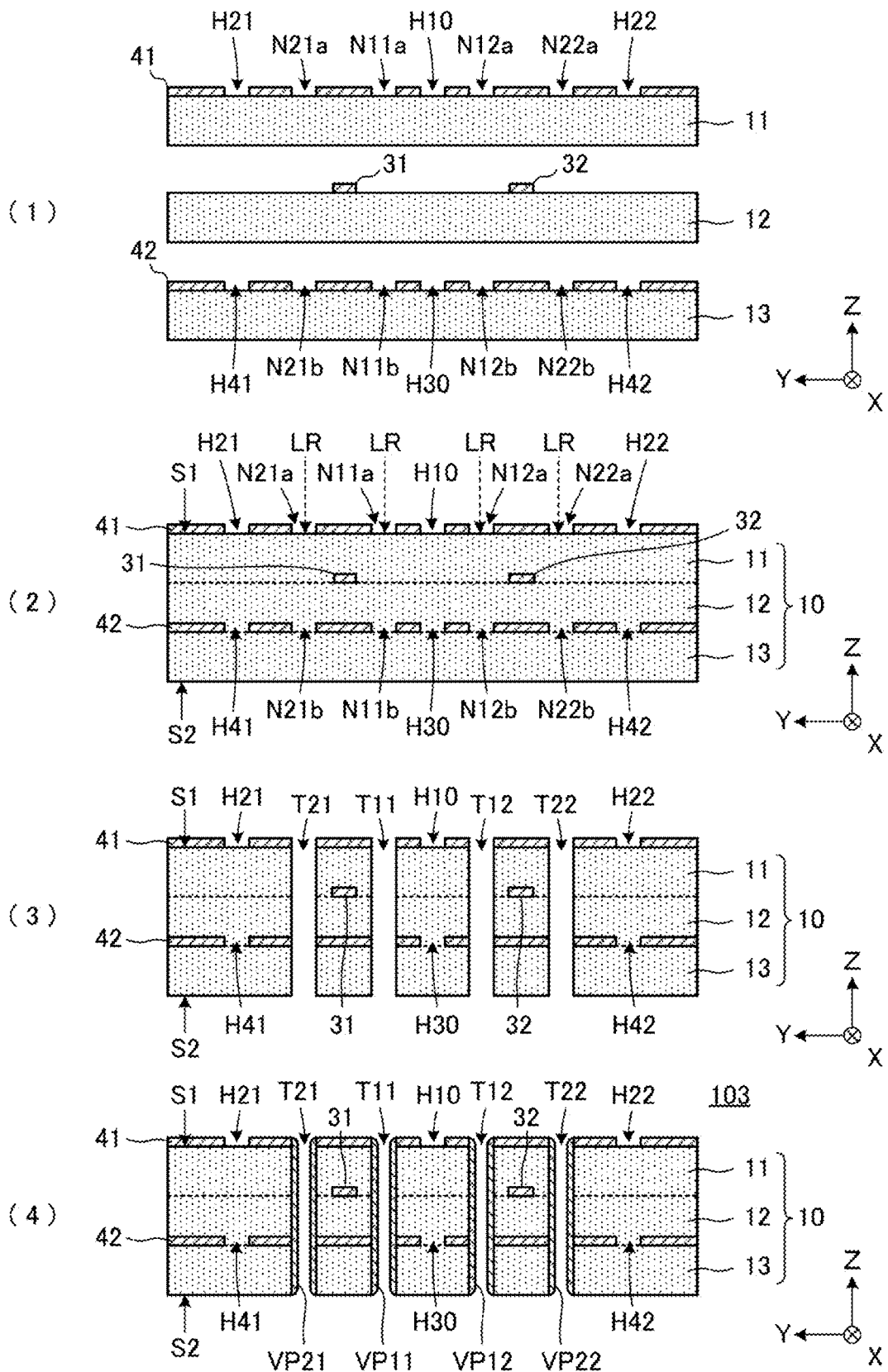
FIG. 13 is a sectional view sequentially showing a manufacturing process of the multilayer substrate 103.

The multilayer substrate 103 according to the present preferred embodiment is manufactured, for example, through the following steps. FIG. 13 is a sectional view sequentially showing a manufacturing process of the multilayer substrate 103. In FIG. 13, for convenience of explanation, the manufacturing process on one chip (individual piece) is described, but the actual manufacturing process of the multilayer substrate is performed in the state of a collective board.

First, as shown in (1) in FIG. 13, a plurality of base material layers 11, 12, and 13 are prepared.

Next, the first signal line 31, the second signal line 32, a first ground conductor 41, a second ground conductor 42, and external electrodes (not shown) are formed on the plurality of base material layers 11, 12, and 13.

In addition to a first opening H10 and second openings H21 and H22, a plurality of openings N11a, N12a, N21a, and N22a are formed in the first ground conductor 41. Further, in addition to a third opening H30 and fourth openings H41 and H42, a plurality of openings N11b, N12b, N21b, and N22b are formed in the second ground conductor 42. The plurality of openings N11a, N11b, N12a, N12b, N21a, N21b, N22a, and N22b are circular through holes (conductor non-formed portions) along the transmission direction (X-axis direction), respectively.

As described above, this step of forming the first signal line 31, the second signal line 32, the first ground conductor 41, and the second ground conductor 42 on the plurality of base material layers 11, 12, and 13, respectively, is an example of the "conductor forming step". Further, this step of forming the first opening H10 and the second openings H21 and H22 on the first ground conductor 41, and forming the third opening H30 and the fourth openings H41 and H42 on the second ground conductor 42 is an example of the "opening forming step".

Next, the plurality of base material layers 13, 12, and 11 are laminated in this order. At this time, when viewed from the laminating direction (Z-axis direction), the plurality of base material layers 11, 12, and 13 are laminated such that the openings of the first ground conductor 41 (openings N11a, N12a, N21a, and N22a) and the openings of the second ground conductor 42 (openings N11b, N12b, N21b, and N22b) respectively overlap with each other. After that, the laminate 10 shown in (2) in FIG. 13 is formed by heat pressing the plurality of laminated base material layers 11, 12, and 13.

This step of laminating the plurality of base material layers 11, 12, and 13 after the "conductor forming step" and the "opening forming step", and heat pressing the plurality of laminated base material layers 11, 12, and 13 to form the laminate 10 is an example of the "laminate forming step".

Next, as shown in (2) and (3) in FIG. 13, the laminate 10 is irradiated with a laser LR, and through holes T11, T12, T21, and T22 extending from the first main surface S1 to the second main surface S2 are formed. Specifically, as shown in (2) in FIG. 13, by irradiating the laminate 10 with the laser LR from the first main surface S1 to the second main surface S2 through the openings N11a, N12a, N21a, and N22a, the through holes T11, T12, T21, and T22 extending from the first main surface S1 to the second main surface S2 are formed.

Because the laser LR is blocked by the first ground conductor 41 and the second ground conductor 42, the diameters of the through holes T11, T12, T21, and T22 do not become larger than necessary.

After that, the interlayer connection conductors VP11, VP12, VP21, and VP22 are formed inside the through holes T11, T12, T21, and T22, respectively, to obtain the multilayer substrate 103 as shown in (4) in FIG. 13. The interlayer connection conductors VP11, VP12, VP21, and VP22 are through hole plating of, for example, Cu formed inside the through holes by, for example, electroless plating.

In this way, this step of forming, after the "conductor forming step", "opening forming step", and "laminate forming step", the through holes T11, T12, T21, and T22 extending from the first main surface S1 to the second main surface S2 and forming plating films inside the through holes T11, T12, T21, and T22 is an example of the "interlayer conductor forming step".

Fourth Preferred Embodiment

In a fourth preferred embodiment of the present invention, an example in which the positions of the interlayer connection conductors are different from that of the first preferred embodiment is shown.

Figure 14A:
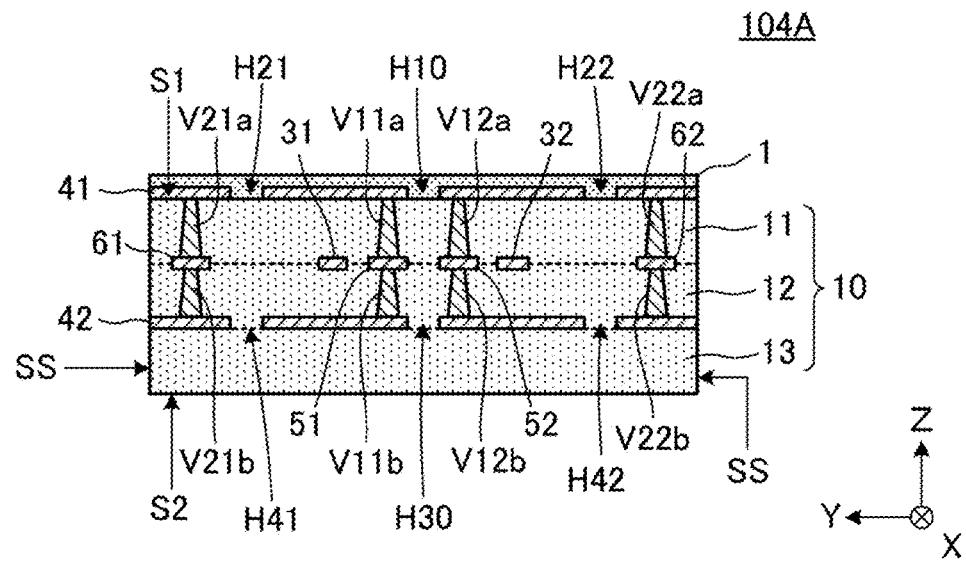
FIG. 14A is a sectional view of a line portion of a multilayer substrate 104A according to a fourth preferred embodiment.
Figure 14B:
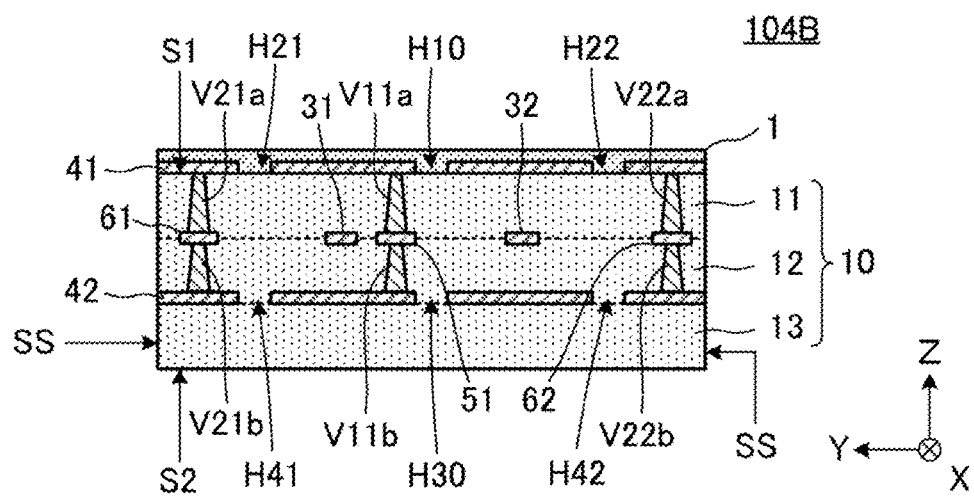
FIG. 14B is a sectional view of a line portion of another multilayer substrate 104B according to the fourth preferred embodiment of the present invention.

FIG. 14A is a sectional view of a line portion of a multilayer substrate 104A according to the fourth preferred embodiment, and FIG. 14B is a sectional view of a line portion of another multilayer substrate 104B according to the fourth preferred embodiment.

The multilayer substrates 104A and 104B is different from the multilayer substrate 101 according to the first preferred embodiment in the arrangement of a plurality of auxiliary ground conductors 61 and 62 and interlayer connection conductors V21a, V21b, V22a, and V22b. Further, the multilayer substrate 104B is different from the multilayer substrate 101 in that a plurality of auxiliary ground conductors 52 and interlayer connection conductors V12a and V12b are not provided. Other configurations of the multilayer substrates 104A and 104B are the same or substantially the same as those of the multilayer substrate 101.

Hereinafter, portions different from the multilayer substrate 101 according to the first preferred embodiment are described.

In the multilayer substrates 104A and 104B, the plurality of auxiliary ground conductors 61 and 62 and the interlayer connection conductors V21a, V21b, V22a, and V22b are disposed further outside in the width direction (Y-axis direction) than the multilayer substrate 101 according to the first preferred embodiment. In other words, in the present preferred embodiment, the plurality of auxiliary ground conductors 61 and 62 and the interlayer connection conductors V21a, V21b, V22a, and V22b are disposed at positions closer to end surfaces SS of a laminate 10 than in the multilayer substrate 101.

Even with the above configuration, the basic configuration of the multilayer substrates 104A and 104B are the same or substantially the same as that of the multilayer substrate 101 according to the first preferred embodiment, and have the same advantageous actions and effects as those of the multilayer substrate 101. However, in terms of reducing or preventing the crosstalk between a first signal line 31 and a second signal line 32, the plurality of auxiliary ground conductors 51 and 52 and the interlayer connection conductors V11a, V11b, V12a, and V12b are preferably provided between the first signal line 31 and the second signal line 32, respectively.

In the present preferred embodiment, an example is shown in which the interlayer connection conductors V21a, V21b, V22a, and V22b are via conductors provided by solidifying the conductive paste, but the present invention is not limited to this configuration. Among the plurality of interlayer connection conductors, the interlayer connection conductors located on the end surface SS sides of the laminate 10 may be, for example, end surface conductors (for example, a plating film of, for example, Cu) provided at the end surfaces SS of the laminate 10 by electroless plating or the like, for example. In this case, the amount of gas generated can be reduced as compared with the case in which the interlayer connection conductors V21a, V21b, V22a, and V22b are via conductors including a resin component. In addition, the shielding properties of the transmission line can be improved by the end surface conductors. However, because the end surface conductors have low gas permeability and the gas is easily trapped when the end surface conductors cover the end surfaces SS of the laminate 10, it is preferable to provide openings near the end surfaces SS of the laminate 10, among the ground conductors.

By providing the end surface conductors on the end surfaces SS of the laminate 10, conduction paths connecting the first ground conductor 41 to the second ground conductor 42 and the line width can be supplemented. Further, when the end surface conductors are provided on the end surfaces SS, the through hole is not necessarily provided in the laminate 10 in order to provide the interlayer connection conductor, and accordingly, the width and area of the laminate 10 can be reduced, and the multilayer substrate can be provided even in a narrow space. For example, by explaining using the multilayer substrate 104A shown in FIG. 14A, in the case of replacing the interlayer connection conductors V21a, V21b, V22a, and V22b located near the end surfaces SS with the end surface conductors, the portions located outside the interlayer connection conductors V21a, V21b, V22a, and V22b in the width direction (Y-axis direction) among the laminate 10 become unnecessary. Therefore, the width and area of the laminate 10 can be reduced by providing the portion of the interlayer connection conductors connecting the first ground conductor 41 to the second ground conductor 42 as the end surface conductors at the end surfaces SS.

In each of the above-described preferred embodiments, examples in each of which the multilayer substrate is the electronic component surface-mounted on the circuit board is shown, but the multilayer substrates according to preferred embodiments of the present invention are not limited to this. The multilayer substrates according to preferred embodiments of the present invention may be a cable connecting two members together or a cable connecting another circuit board to a component. Further, a connector may be provided at the connecting portion of the multilayer substrate, as needed. Further, the laminate of the multilayer substrate may include a bent portion. In particular, if the laminate includes a bent portion, delamination tends to occur easily due to the stress related to the bent portion. Therefore, the configurations of preferred embodiments of the present invention are effective in reducing or preventing the delamination.

In each of the above-described preferred embodiments, examples of a multilayer substrate including the first connecting portion CN1, the second connecting portion CN2, and the line portion TL is shown, but the number of connecting portions and line portions provided in the multilayer substrates can be appropriately changed within a range in which the advantageous actions and effects of preferred embodiments of the present invention are achieved.

In each of the above-described preferred embodiments, examples in which the laminate 10 is a rectangular or substantially rectangular flat plate is shown, but the present invention is not limited to this configuration. The shape of the laminate 10 can be appropriately changed within the range in which the advantageous actions and effects of preferred embodiments of the present invention are achieved. The planar shape of the laminate 10 may be, for example, L-shaped, crank-shaped, T-shaped, Y-shaped, or others.

Further, in each of the above-described preferred embodiments, examples of the laminate 10 including three base material layers that are laminated is shown, but the laminate of the present invention is not limited to this. The number of layers of the base material layer of the laminate 10 can be appropriately changed within the range in which the advantageous actions and effects of preferred embodiments of the present invention are achieved. Further, in the multilayer substrates according to preferred embodiments of the present invention, the protective layer provided on the surface of the laminate 10 is not essential.

In each of the above-described preferred embodiments, examples of the laminate 10 being a flat plate including thermoplastic resin as main material is shown, but the present invention is not limited to this configuration. The laminate may be a flat plate mainly made of thermosetting resin, for example. Further, the laminate may be, for example, dielectric ceramics of low temperature co-fired ceramics (LTCC). Further, the laminate may be a composite laminate of a plurality of types of resin, and may be formed by laminating a thermosetting resin sheet such as a glass/epoxy substrate and a thermoplastic resin sheet. Further, the laminate is not limited to the one in which a plurality of base material layers are heat pressed (batch pressing) to fuse the surfaces thereof, but a structure having an adhesive layer between each base material layer may be used.

Further, a circuit configuration provided on the multilayer substrate is not limited to the configurations of the above-described preferred embodiments, and can be appropriately changed within the range in which the advantageous actions and effects of preferred embodiments of the present invention are achieved. The circuits provided on a multilayer substrate may include, for example, coils defined by conductor patterns, capacitors defined by conductor patterns, and frequency filters such as various filters (low-pass filter, high-pass filter, band-pass filter, and band-elimination filter). Further, for example, various types of other transmission lines (microstrip line, meander line, coplanar, etc., for example) may be provided on the multilayer substrate. Further, various electronic components, such as chip components, may be mounted on or embedded in the multilayer substrate.

In each of the above-described preferred embodiments, examples of a multilayer substrate in which two transmission lines (the first transmission line and the second transmission line) are provided is shown, but the present invention is not limited to this configuration, and the number of transmission lines can be appropriately changed depending on the circuit configuration formed on the multilayer substrate.

Further, in each of the above-described preferred embodiments, examples in which the first signal line 31 and the second signal line 32 are parallel extending portions SP in their entirety is shown, but the present invention is not limited to this configuration. Only a portion of the first signal line 31 and the second signal line 32 may be parallel extending portions. Further, the first signal line 31 and the second signal line 32 are not limited to the linear conductor pattern extending in the X-axis direction, and may be a linear conductor pattern curved or bent in the Y-axis direction. That is, the transmission direction is not limited to the X-axis direction.

In each of the above-described preferred embodiments, examples are shown in which the rectangular or substantially rectangular external electrodes P1, P2, P3, and P4 are provided on the first main surface S1 of the laminate 10, but the configuration is not limited to this. The shape, number, and position of the external electrodes can be appropriately changed within the range in which the advantageous actions and effects of preferred embodiments of the present invention are achieved. The planar shape of the external electrode may be, for example, polygonal, circular, elliptical, circular arc, ring-shaped, L-shaped, U-shaped, T-shaped, Y-shaped, crank-shaped, or others. Further, the external electrodes may be provided on the first main surface S1 and the second main surface S2 of the laminate 10, respectively. Further, the number of external electrodes can be appropriately changed depending on the circuit configuration of the multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a laminate including a plurality of base material layers that are laminated;
    a first signal line and a second signal line provided in the laminate, extending along a transmission direction, and including parallel extending portions extending in parallel or substantially in parallel with each other;
    a first ground conductor and a second ground conductor provided in the laminate and sandwiching the first signal line and the second signal line in a laminating direction of the plurality of base material layers; and
    a plurality of interlayer connection conductors provided in the laminate and connecting the first ground conductor to the second ground conductor; wherein
    the plurality of interlayer connection conductors are arrayed in the transmission direction, and are disposed at least between the first signal line and the second signal line in the parallel extending portions;
    the first ground conductor includes a first opening and a second opening;
    the second ground conductor includes a third opening and a fourth opening;
    the first opening and the third opening extend continuously along the parallel extending portions, and are disposed between the first signal line and the second signal line in the parallel extending portions when viewed from the laminating direction; and
    the second opening and the fourth opening are disposed farther outside in a width direction orthogonal or substantially orthogonal to the transmission direction than the parallel extending portions.

2. The multilayer substrate according to claim 1, comprising:
    a first external electrode and a second external electrode provided on a main surface of the laminate; and
    a plurality of signal interlayer connection conductors provided in the laminate; wherein
    the first external electrode is connected to the first signal line via at least one of the plurality of signal interlayer connection conductors;
    the second external electrode is connected to the second signal line via at least another one of the plurality of signal interlayer connection conductors; and
    the first signal line and the second signal line overlap with the first external electrode and the second external electrode in the parallel extending portions, respectively, when viewed from the laminating direction.

3. The multilayer substrate according to claim 1, wherein the plurality of interlayer connection conductors sandwich each of the first signal line and the second signal line in the width direction.

4. The multilayer substrate according to claim 1, wherein the first ground conductor is connected to the second ground conductor via an end surface conductor provided on an end surface of the laminate.

5. The multilayer substrate according to claim 1, wherein the plurality of base material layers are mainly made of resin.

6. The multilayer substrate according to claim 5, wherein the resin is thermoplastic resin.

7. The multilayer substrate according to claim 1, wherein the second opening and the fourth opening continuously extend along the parallel extending portions.

8. The multilayer substrate according to claim 1, wherein a plurality of each of the second openings and the fourth openings are provided, and the plurality of second openings and the plurality of fourth openings are disposed along the parallel extending portions.

9. The multilayer substrate according to claim 1, wherein each of the first opening and the third opening has a length in the transmission direction equal to or more than a wavelength of a frequency band used.

10. The multilayer substrate according to claim 7, wherein each of the second opening and the fourth opening has a length in the transmission direction equal to or more than a wavelength of a frequency band used.

11. The multilayer substrate according to claim 1, wherein the plurality of interlayer connection conductors disposed in the transmission direction are spaced apart from one another by a distance of equal to or less than about a tenth of a wavelength of a frequency band used.

12. The multilayer substrate according to claim 1, wherein at least one of the first opening, the second opening, the third opening, or the fourth opening is spaced apart from the first signal line or the second signal line by a distance of equal to or less than about a tenth of a wavelength of a frequency band used.

13. The multilayer substrate according to claim 1, wherein at least one of the first opening, the second opening, the third opening, or the fourth opening is spaced apart from the plurality of interlayer connection conductors by a distance of equal to or less than about a tenth of a frequency band used.

14. The multilayer substrate according to claim 1, wherein the first opening, the second opening, the third opening, or the fourth opening has a width of equal to or less than a tenth of a wavelength of a frequency band used.

15. An electronic device comprising:
the multilayer substrate according to claim 1; and
a circuit board on which the multilayer substrate is surface-mounted.

16. A method of manufacturing a multilayer substrate comprising:
a conductor forming step of forming a first signal line and a second signal line extending along a transmission direction and including parallel extending portions extending in parallel or substantially in parallel with each other, a first ground conductor, and a second ground conductor on at least one of a plurality of base material layers;
an opening forming step of forming a first opening and a second opening extending in the transmission direction in the first ground conductor, and forming a third opening and a fourth opening extending in the transmission direction in the second ground conductor;
a laminate forming step of forming, after the conductor forming step and the opening forming step, a laminate by laminating the plurality of base material layers such that the first ground conductor and the second ground conductor sandwich the first signal line and the second signal line and by heat pressing the plurality of base material layers that are laminated; and
an interlayer conductor forming step of connecting the first ground conductor to the second ground conductor and forming the plurality of interlayer connection conductors arrayed in the transmission direction in any of the plurality of base material layers; wherein
the first opening and the third opening are disposed between the first signal line and the second signal line in the parallel extending portions when viewed from the laminating direction;
the second opening and the fourth opening are disposed further outside in a width direction orthogonal or substantially orthogonal to the transmission direction than the parallel extending portions; and
the plurality of interlayer connection conductors are at least partially disposed between the first signal line and the second signal line in the parallel extending portions.

17. The method of manufacturing the multilayer substrate according to claim 16, wherein
the conductor forming step includes a step of forming a first external electrode and a second external electrode on at least one of the plurality of base material layers;
the laminate forming step includes a step of laminating the plurality of base material layers such that, when viewed from the laminating direction, the first external electrode overlaps with the first signal line in the parallel extending portions, and the second external electrode overlaps with the second signal line in the parallel extending portions; and
the interlayer conductor forming step includes a step of forming signal interlayer connection conductors that connect between the first signal line and the first external electrode, and between the second signal line and the second external electrode, respectively, in at least one of the plurality of base material layers.

18. The method of manufacturing the multilayer substrate according to claim 16, wherein the laminate forming step includes a step of laminating and heat pressing the plurality of base material layers using thermoplastic resin as a main material.

19. The method of manufacturing the multilayer substrate according to claim 16, wherein
the interlayer conductor forming step includes, before the laminate forming step, a step of providing a hole in at least one of the plurality of base material layers and arranging conductive paste in the hole; and
the laminate forming step includes a step of solidifying the conductive paste by heat pressing.

20. The method of manufacturing the multilayer substrate according to claim 16, wherein the interlayer conductor forming step includes, after the laminate forming step, a step of forming a through hole penetrating the laminate and forming a plating film in the through hole.

* * * * *